(12) United States Patent
Akahane

(10) Patent No.: US 11,196,956 B2
(45) Date of Patent: Dec. 7, 2021

(54) SOLID-STATE IMAGE SENSOR, IMAGING DEVICE, AND METHOD OF CONTROLLING SOLID-STATE IMAGE SENSOR

(71) Applicant: SONY SEMICONDUCTOR SOLUTIONS CORPORATION, Kanagawa (JP)

(72) Inventor: Takahiro Akahane, Tokyo (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 16/759,615

(22) PCT Filed: Sep. 21, 2018

(86) PCT No.: PCT/JP2018/035037
§ 371 (c)(1),
(2) Date: Apr. 27, 2020

(87) PCT Pub. No.: WO2019/087612
PCT Pub. Date: May 9, 2019

(65) Prior Publication Data
US 2020/0280692 A1 Sep. 3, 2020

(30) Foreign Application Priority Data
Nov. 6, 2017 (JP) .............................. JP2017-214096

(51) Int. Cl.
*H04N 5/378* (2011.01)
*H04N 5/359* (2011.01)

(52) U.S. Cl.
CPC ........... *H04N 5/378* (2013.01); *H04N 5/3595* (2013.01)

(58) Field of Classification Search
CPC ............................. H04N 5/378; H04N 5/3595
(Continued)

(56) References Cited

U.S. PATENT DOCUMENTS 10,263,625 B1 * 4/2019 Tokairin ................ H03L 7/0992
2009/0091641 A1 4/2009 Hattori
(Continued)

FOREIGN PATENT DOCUMENTS

CN 101309361 A 11/2008
CN 102780858 A 11/2012
(Continued)

OTHER PUBLICATIONS

International Search Report and Written Opinion of PCT Application No. PCT/JP2018/035037, dated Dec. 4, 2018, 07 pages of ISRWO.

*Primary Examiner* — Joel W Fosselman
(74) *Attorney, Agent, or Firm* — Chip Law Group

(57) ABSTRACT

To reduce the number of ADCs in a solid-state image sensor that converts an analog pixel signal into a digital signal. An effective pixel generates an analog signal according to an amount of received light as an effective pixel signal using a power supply from a power supply line. A correction signal generation unit generates an analog signal including a noise component generated in the power supply line as a correction signal. A selection unit sequentially selects and outputs the effective pixel signal and the correction signal. An analog-digital converter performs processing of converting the output effective pixel signal into a digital signal and outputting the digital signal as effective pixel data and processing of converting the output correction signal into a digital signal and outputting the digital signal into correction data. A signal processing unit corrects the effective pixel data on the basis of the correction data.

13 Claims, 27 Drawing Sheets

(58) Field of Classification Search
USPC .......................................................... 348/248
See application file for complete search history.

(56) References Cited

U.S. PATENT DOCUMENTS

2009/0244338 A1* 10/2009 Kume .................... H04N 5/361
                                                           348/294
2012/0286138 A1   11/2012 Yamazaki

FOREIGN PATENT DOCUMENTS

| JP | 2008-288816 A | 11/2008 |
| JP | 2009-239383 A | 10/2009 |
| JP | 2012-253740 A | 12/2012 |
| KR | 10-2008-0101803 A | 11/2008 |

* cited by examiner

FIG. 12

|  | 0TH ADC | 1ST ADC | 2ND ADC | 3RD ADC | 4TH ADC | 5TH ADC | 6TH ADC | 7TH ADC | 8TH ADC |
|---|---|---|---|---|---|---|---|---|---|
| 9kTH TIME | DK | SIG0 | SIG0 | SIG0 | SIG0 | SIG0 | SIG0 | SIG0 | SIG0 |
| (9k+1)ST TIME | SIG0 | DK | SIG1 | SIG1 | SIG1 | SIG1 | SIG1 | SIG1 | SIG1 |
| (9k+2)ND TIME | SIG1 | SIG1 | DK | SIG2 | SIG2 | SIG2 | SIG2 | SIG2 | SIG2 |
| (9k+3)RD TIME | SIG2 | SIG2 | SIG2 | DK | SIG3 | SIG3 | SIG3 | SIG3 | SIG3 |
| (9k+4)TH TIME | SIG3 | SIG3 | SIG3 | SIG3 | DK | SIG4 | SIG4 | SIG4 | SIG4 |
| (9k+5)TH TIME | SIG4 | SIG4 | SIG4 | SIG4 | SIG4 | DK | SIG5 | SIG5 | SIG5 |
| (9k+6)TH TIME | SIG5 | SIG5 | SIG5 | SIG5 | SIG5 | SIG5 | DK | SIG6 | SIG6 |
| (9k+7)TH TIME | SIG6 | SIG6 | SIG6 | SIG6 | SIG6 | SIG6 | SIG6 | DK | SIG7 |
| (9k+8)TH TIME | SIG7 | SIG7 | SIG7 | SIG7 | SIG7 | SIG7 | SIG7 | SIG7 | DK |

FIG. 13

| | 0TH ADC | 1ST ADC | 2ND ADC | 3RD ADC | 4TH ADC | 5TH ADC | 6TH ADC | 7TH ADC | 8TH ADC |
|---|---|---|---|---|---|---|---|---|---|
| 9kTH TIME | SIG0 | SIG0 | DK | SIG0 | SIG0 | SIG0 | SIG0 | SIG0 | SIG0 |
| (9k+1)ST TIME | SIG1 | SIG1 | SIG0 | SIG1 | SIG1 | SIG1 | SIG1 | SIG1 | DK |
| (9k+2)ND TIME | SIG2 | SIG2 | SIG1 | SIG2 | DK | SIG2 | SIG2 | SIG2 | SIG1 |
| (9k+3)RD TIME | SIG3 | SIG3 | SIG2 | SIG3 | SIG2 | SIG3 | DK | SIG3 | SIG2 |
| (9k+4)TH TIME | DK | SIG4 | SIG3 | SIG4 | SIG3 | SIG4 | SIG3 | SIG4 | SIG3 |
| (9k+5)TH TIME | SIG4 | SIG5 | SIG4 | SIG5 | SIG4 | DK | SIG4 | SIG5 | SIG4 |
| (9k+6)TH TIME | SIG5 | SIG6 | SIG5 | SIG6 | SIG5 | SIG5 | SIG5 | DK | SIG5 |
| (9k+7)TH TIME | SIG6 | DK | SIG6 | SIG7 | SIG6 | SIG6 | SIG6 | SIG6 | SIG6 |
| (9k+8)TH TIME | SIG7 | SIG7 | SIG7 | DK | SIG7 | SIG7 | SIG7 | SIG7 | SIG7 |

*FIG. 14*

|  | 0TH ADC | 1ST ADC | 2ND ADC | 3RD ADC | 4TH ADC | 5TH ADC | 6TH ADC | 7TH ADC | 8TH ADC |
|---|---|---|---|---|---|---|---|---|---|
| 10kTH TIME | DK | DK | DK | DK | DK | DK | DK | DK | DK |
| (10k+1)ST TIME | DK | SIG0 | SIG0 | SIG0 | SIG0 | SIG0 | SIG0 | SIG0 | SIG0 |
| (10k+2)ND TIME | SIG0 | DK | SIG1 | SIG1 | SIG1 | SIG1 | SIG1 | SIG1 | SIG1 |
| (10k+3)RD TIME | SIG1 | SIG1 | DK | SIG2 | SIG2 | SIG2 | SIG2 | SIG2 | SIG2 |
| (10k+4)TH TIME | SIG2 | SIG2 | SIG2 | DK | SIG3 | SIG3 | SIG3 | SIG3 | SIG3 |
| (10k+5)TH TIME | SIG3 | SIG3 | SIG3 | SIG3 | DK | SIG4 | SIG4 | SIG4 | SIG4 |
| (10k+6)TH TIME | SIG4 | SIG4 | SIG4 | SIG4 | SIG4 | DK | SIG5 | SIG5 | SIG5 |
| (10k+7)TH TIME | SIG5 | SIG5 | SIG5 | SIG5 | SIG5 | SIG5 | DK | SIG6 | SIG6 |
| (10k+8)TH TIME | SIG6 | SIG6 | SIG6 | SIG6 | SIG6 | SIG6 | SIG6 | DK | SIG7 |
| (10k+9)TH TIME | SIG7 | SIG7 | SIG7 | SIG7 | SIG7 | SIG7 | SIG7 | SIG7 | DK |

SOLID-STATE IMAGE SENSOR, IMAGING DEVICE, AND METHOD OF CONTROLLING SOLID-STATE IMAGE SENSOR

CROSS REFERENCE TO RELATED APPLICATIONS

This application is a U.S. National Phase of International Patent Application No. PCT/JP2018/035037 filed on Sep. 21, 2018, which claims priority benefit of Japanese Patent Application No. JP 2017-214096 filed in the Japan Patent Office on Nov. 6, 2017. Each of the above-referenced applications is hereby incorporated herein by reference in its entirety.

TECHNICAL FIELD

The present technology relates to a solid-state image sensor, an imaging device, and a method of controlling a solid-state image sensor. Specifically, the present technology relates to a solid-state image sensor provided with an analog to digital converter (ADC), an imaging device, and a method of controlling a solid-state image sensor.

BACKGROUND ART

Conventionally, as an imaging device, for example, a solid-state imaging device configured using a charge coupled device (CCD) image sensor, a complementary MOS (CMOS) image sensor, or the like is known. In a case where the solid-state imaging device images a high-luminance object, belt-shaped streaking occurs in a captured image in a horizontal direction. Furthermore, a power supply voltage may fluctuate due to factors such as electromagnetic induction, and stripe noise may occur in image data due to the fluctuation in the power supply voltage. To suppress the streaking and stripe noise, for example, a solid-state image sensor that corrects a pixel signal of an effective pixel using a correction signal from a light shielding pixel has been proposed (for example, see Patent Document 1). In this solid-state image sensor, ADCs are arranged for each of the effective pixel column and light shielding pixel column.

CITATION LIST

Patent Document

Patent Document 1: Japanese Patent Application Laid-Open No. 2008-288816

SUMMARY OF THE INVENTION

Problems to be Solved by the Invention

In the above-described conventional technology, the correction signal from the light shielding pixel includes a noise component due to the fluctuations in the power supply voltage. For this reason, the above-described solid-state image sensor eliminates the noise component by subtracting a statistic value of values obtained by analog to digital (AD) conversion for the correction signal from an AD conversion value of the pixel signal, thereby suppressing the noise due to the streaking and voltage fluctuation. However, the above-described conventional technology has a problem that the number of ADCs becomes large and the mounting area and cost are increased as compared with a case of arranging ADCs only for columns of effective pixels, because the ADCs are arranged for both columns of light shielding pixels and effective pixels.

The present technology has been made in view of such a situation, and an object thereof is to reduce the number of ADCs in a solid-state image sensor that converts an analog pixel signal into a digital signal.

Solutions to Problems

The present technology has been made to solve the above-described problems, and the first aspect of the present technology is a solid-state image sensor including: an effective pixel configured to generate an analog signal according to an amount of received light using a power supply from a power supply line as an effective pixel signal; a correction signal generation unit configured to generate an analog signal including a noise component generated in the power supply line as a correction signal; a selection circuit configured to sequentially select and output the effective pixel signal and the correction signal; an analog-digital converter configured to perform processing of converting the output effective pixel signal into a digital signal and outputting the digital signal as effective pixel data and processing of converting the output correction signal into a digital signal and outputting the digital signal as correction data; and a signal processing unit configured to correct the effective pixel data on the basis of the correction data and a method of controlling the solid-state image sensor. The above configuration brings an effect of sequentially selecting the effective pixel signal and the correction signal and converting the signals into the digital signals.

Furthermore, in the first aspect, the correction signal generation unit may include a shielded light shielding pixel. The above configuration brings an effect to sequentially selecting the effective pixel signal and the light shielding pixel signal from the light shielding pixel.

Furthermore, in the first aspect, the correction signal generation unit may include a high-pass filter that allows pass of a high-frequency component higher than a predetermined frequency in a signal from the power supply line and outputs the high-frequency component as the correction signal. The above configuration brings an effect to sequentially selecting the high-frequency component of a signal from the power supply line and the effective pixel signal.

Furthermore, in the first aspect, the analog-digital converter may be a successive approximation register analog to digital converter (SARADC). The above configuration brings an effect of converting the effective pixel signal and the correction signal into the digital signals by the SARADC.

Furthermore, in the first aspect, a timing control unit configured to control operation timing of the selection circuit may be further included, and a predetermined number of the selection circuits may be arrayed, and the timing control unit may cause any one of the predetermined number of selection circuits to output the correction signal and cause the remaining selection circuits to output the effective pixel signal. The above configuration brings an effect of converting the correction signal from the sequentially selected selection circuit into the correction data.

Furthermore, in the first aspect, the timing control unit may sequentially select the predetermined number of selection circuits in a predetermined order and cause the selected selection circuit to output the correction signal. The above configuration brings an effect of converting the correction signal from the selection circuit selected in the predetermined order into the correction data.

Furthermore, in the first aspect, the timing control unit may generate a random number indicating any one of the predetermined number of selection circuits, select the selection circuit indicated by the random number, and cause the selected selection circuit to output the correction signal. An effect of converting the correction signal from the selection circuit indicated by the random number into the correction data is brought.

Furthermore, in the first aspect, a predetermined number of the effective pixels may be arrayed in a pixel array unit in a two-dimensional grid manner, the pixel array unit may be divided into a plurality of effective pixel areas, and the selection circuit may sequentially select the effective pixel signal and the correction signal from any one of the plurality of effective pixel areas. The above configuration brings an effect of converting the effective pixel signal and the correction signal from any one of the plurality of effective pixel areas into the digital signals.

Furthermore, in the first aspect, the effective pixels may be arrayed in a Bayer array in the pixel array unit. The above configuration brings an effect of converting the effective pixel signals from the pixel array unit in the Bayer array into the digital signals.

Furthermore, in the first aspect, each of a plurality of adjacent effective pixels in the pixel array unit may photoelectrically convert light in same color to generate the effective pixel signal. The above configuration brings an effect of converting the effective pixel signals from the pixel array unit having the plurality of adjacent effective pixels in the same color into the digital signals.

Furthermore, in the first aspect, a pair of the adjacent effective pixels in the pixel array unit may be pixels for detecting a phase difference of a pair of images. The above configuration brings an effect of detecting a focal point from the phase difference.

Furthermore, in the first aspect, a plurality of effective pixels having different light receiving areas from one another may be arrayed in the pixel array unit. The above configuration brings an effect of converting the effective pixel signals from the pixel array unit in which the plurality of effective pixels having different light receiving areas from one another is arrayed into the digital signals.

Furthermore, the second aspect of the present technology is an imaging device including an effective pixel configured to generate an analog signal according to an amount of received light using a power supply from a power supply line as an effective pixel signal; a correction signal generation unit configured to generate an analog signal including a noise component generated in the power supply line as a correction signal; a selection circuit configured to sequentially select and output the effective pixel signal and the correction signal; an analog-digital converter configured to perform processing of converting the output effective pixel signal into a digital signal and outputting the digital signal as effective pixel data and processing of converting the output correction signal into a digital signal and outputting the digital signal as correction data; a signal processing unit configured to correct the effective pixel data on the basis of the correction data; and an image processing unit configured to execute predetermined image processing for image data including the corrected effective pixel data.

Effects of the Invention

According to the present technology, a solid-state image sensor that converts an analog pixel signal into a digital signal can exert an excellent effect of capable of reducing the number of ADCs. Note that effects described here are not necessarily limited, and any of effects described in the present disclosure may be exhibited.

BRIEF DESCRIPTION OF DRAWINGS

FIG. 12 is a diagram illustrating an example of a signal selection order according to the first embodiment of the present technology.

FIG. 13 is a diagram illustrating an example of a randomly selected order according to the first embodiment of the present technology.

FIG. 14 is a diagram illustrating another example of the signal selection order according to the first embodiment of the present technology.

MODE FOR CARRYING OUT THE INVENTION

Hereinafter, modes for implementing the present technology (hereinafter referred to as embodiments) will be described. Description will be given according to the following order.
1. First Embodiment (an example of sequentially selecting an effective pixel signal and a correction signal)
2. Second Embodiment (an example of sequentially selecting an effective pixel signal and a correction signal from a high-pass filter)
3. Application Examples to Moving Body 1. First Embodiment

Figure 1:
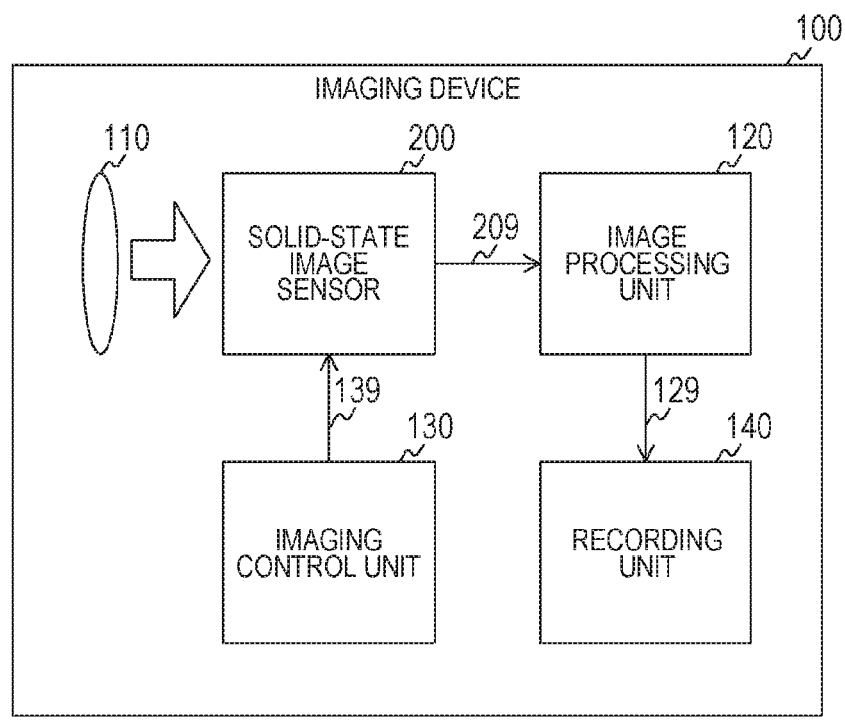
FIG. 1 is a block diagram illustrating a configuration example of an imaging device according to a first embodiment of the present technology.

[Configuration Example of Imaging Device]
FIG. 1 is a block diagram illustrating a configuration example of an imaging device 100 according to a first embodiment of the present technology. The imaging device 100 is a device having an imaging function, and includes an imaging lens 110, a solid-state image sensor 200, an image processing unit 120, an imaging control unit 130, and a recording unit 140. As the imaging device 100, a digital camera, a smartphone, a personal computer, or the like is assumed.

The imaging lens 110 condenses light from an object and guides the light to the solid-state image sensor 200.

The solid-state image sensor 200 images image data in synchronization with a vertical synchronization signal VSYNC from the imaging control unit 130. Here, the vertical synchronization signal VSYNC is a timing signal indicating imaging timing. For example, a periodic signal of 30 hertz (Hz) or 60 hertz (Hz) is used as the vertical synchronization signal VSYNC. The solid-state image sensor 200 supplies the image data to the image processing unit 120 via a signal line 209.

The imaging control unit 130 controls the solid-state image sensor 200. The imaging control unit 130 supplies the vertical synchronization signal VSYNC, a signal for controlling an exposure time, and the like to the solid-state image sensor 200 via a signal line 139. Furthermore, the imaging control unit 130 starts supply of the vertical synchronization signal VSYNC when an operation to start imaging (such as pressing a shutter button) is performed, for example.

The image processing unit 120 executes predetermined image processing such as demosaic processing and white balance processing for the image data. The image processing unit 120 supplies the processed image data to the recording unit 140 via a signal line 129. The recording unit 140 records the image data.

Figure 2:
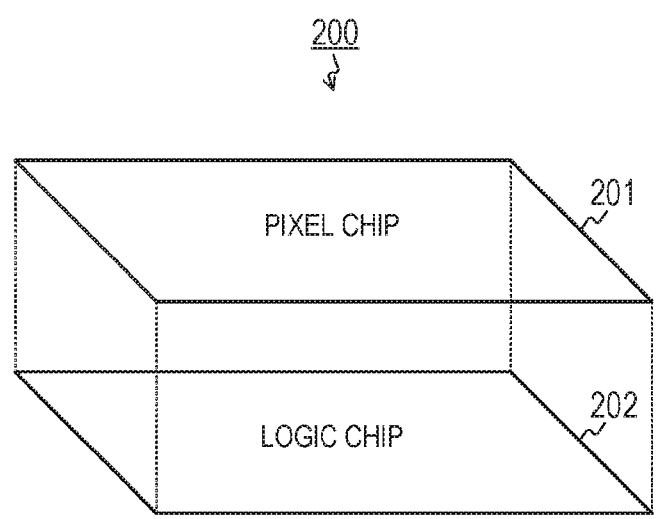
FIG. 2 is a diagram illustrating an example of a stacked structure of a solid-state image sensor according to the first embodiment of the present technology.

FIG. 2 is a diagram illustrating an example of a stacked structure of the solid-state image sensor 200 according to the first embodiment of the present technology. The solid-state image sensor 200 includes a pixel chip 201 and a logic chip 202 stacked on the pixel chip 201.

Figure 3:
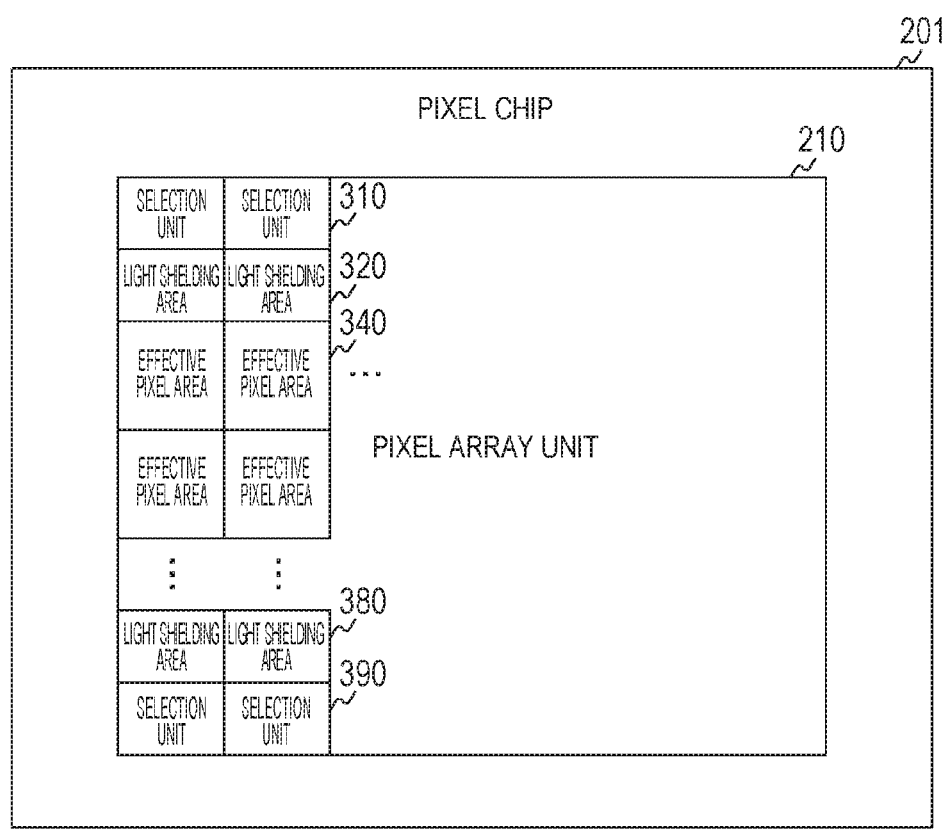
FIG. 3 is an example of a plan view of a pixel chip according to the first embodiment of the present technology.

[Configuration Example of Pixel Chip]
FIG. 3 is an example of a plan view of the pixel chip 201 according to the first embodiment of the present technology. The pixel chip 201 includes a pixel array unit 210 in which a plurality of pixels is arrayed in a two-dimensional grid manner. Here, the pixels arrayed in the pixel array unit 210 are classified into light shielding pixels shielded from light and effective pixels not shielded from light. Among these pixels, the effective pixels are arranged in effective pixel areas 340. Furthermore, the light shielding pixels are arranged in light shielding areas 320 and 380 provided around the effective pixel areas 340. Furthermore, selection units 310 are arranged between the light shielding area 320 and an outer periphery of the pixel array unit 210, and selection units 390 are arranged between the light shielding area 380 and the outer periphery of the pixel array unit 210. Details of the configuration of the selection units 310 and 390 will be described below.

For example, the pixel array unit 210 has M×N (M and N are integers) effective pixel areas 340 arrayed in M rows×N columns. Then, the light shielding area 320 is arranged above each of columns of the effective pixel areas 340 and the light shielding area 380 is arranged below the each column of the effective pixel areas 340, where a predetermined direction parallel to a vertical direction is an up direction. Furthermore, the selection unit 310 is arranged above each of the light shielding areas 320 and the selection unit 390 is arranged below each of the light shielding areas 380. Since the effective pixel areas 340 have N rows, N light shielding areas 320, N light shielding areas 380, N selection units 310, and N selection units 390 are arranged.

Figure 4:
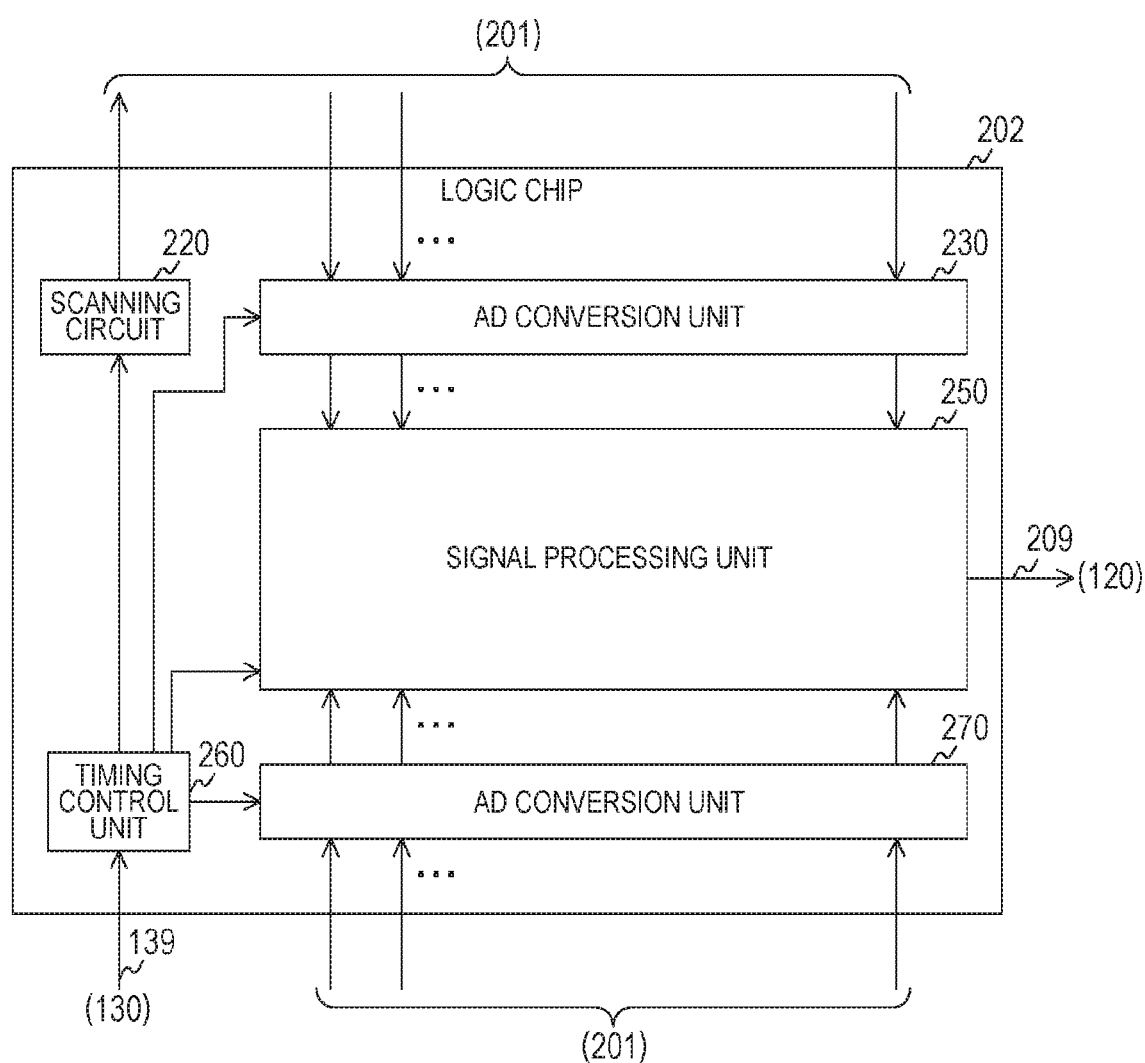
FIG. 4 is a block diagram illustrating a configuration example of a logic chip according to the first embodiment of the present technology.

[Configuration Example of Logic Chip]
FIG. 4 is a block diagram illustrating a configuration example of the logic chip 202 according to the first embodiment of the present technology. The logic chip 202 includes a scanning circuit 220, AD conversion units 230 and 270, a signal processing unit 250, and a timing control unit 260.

The timing control unit 260 controls operation timing of each circuit in the logic chip 202 in synchronization with the vertical synchronization signal VSYNC from the imaging control unit 130.

The scanning circuit 220 drives pixels in the pixel chip 201 in a predetermined order. The AD conversion unit 230 converts each analog signal from the selection unit 310 in the pixel chip 201 into a digital signal and supplies the digital signal to the signal processing unit 250. The AD conversion unit 270 converts each analog signal from the selection unit 390 in the pixel chip 201 into a digital signal and supplies the digital signal to the signal processing unit 250.

The signal processing unit 250 executes predetermined signal processing for the digital signals from the AD conversion units 230 and 270 to generate image data. The signal processing unit 250 supplies the image data to the image processing unit 120.

Note that, although the pixel array unit 210 is arranged on the pixel chip 201 and the others are arranged on the logic chip 202, the arrangement on each chip is not limited to this configuration. For example, a part of the circuit in the pixel can be arranged on the logic chip 202. Furthermore, although both the AD conversion units 230 and 270 are arranged, a configuration having only one of the AD conversion units 230 and 270 can be adopted.

[Configuration Example of Pixel Array Unit]

Figure 5:
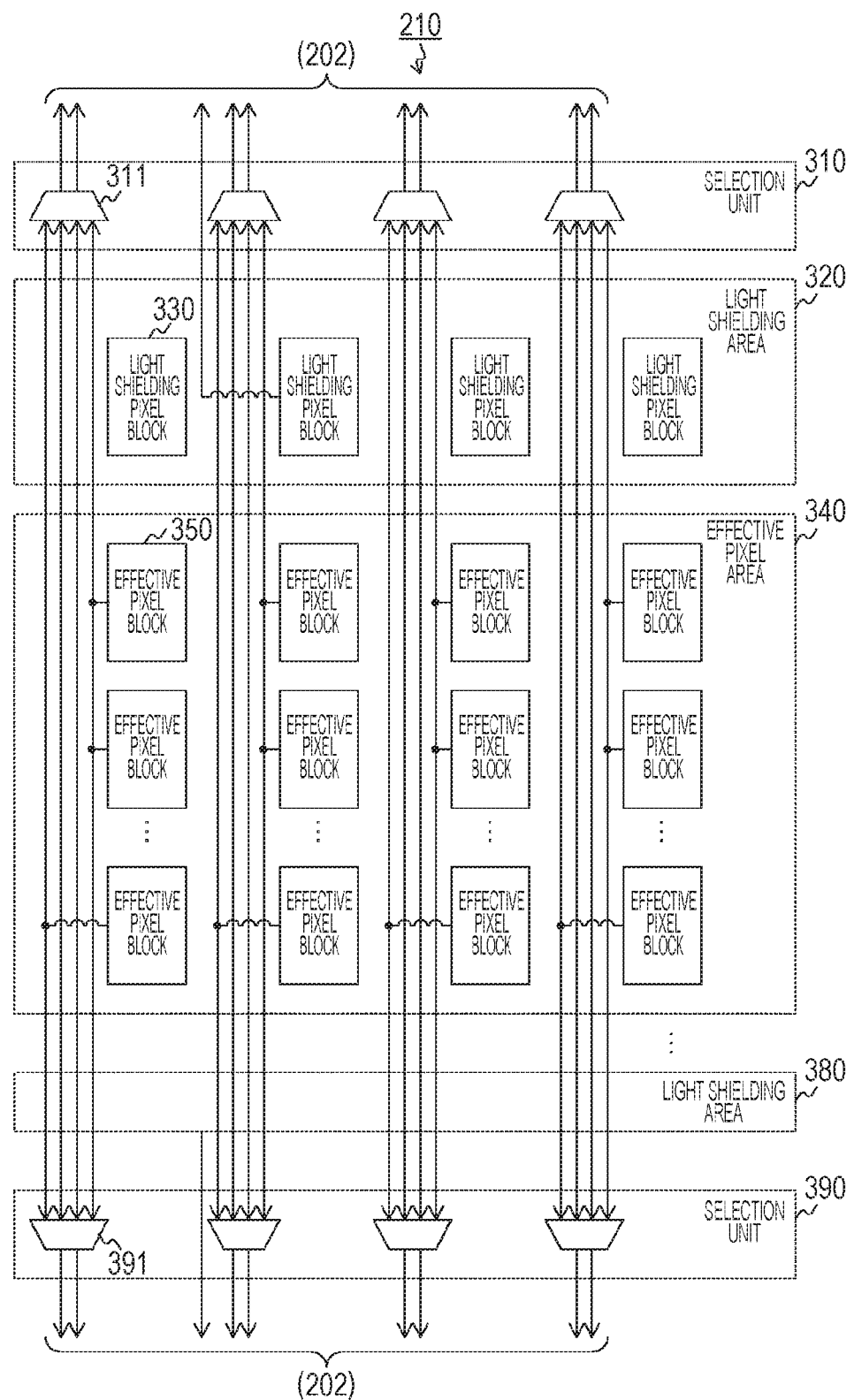
FIG. 5 is an example of a plan view of a pixel array unit according to the first embodiment of the present technology.

FIG. 5 is an example of a plan view of the pixel array unit 210 according to the first embodiment of the present technology. The selection unit 310 has four multiplexers 311 arrayed in a horizontal direction, and the light shielding area 320 has four light shielding pixel blocks 330 arrayed in the horizontal direction. The effective pixel area 340 has thirty two effective pixel blocks 350 arrayed in eight rows×four columns. Furthermore, the configuration of the light shielding area 380 is similar to that of the light shielding area 320. The selection unit 390 has four multiplexers 391 arrayed in the horizontal direction, similarly to the selection unit 310.

Four vertical signal lines are wired along the vertical direction for each column of the effective pixel blocks 350. Since the effective pixel blocks 350 have four columns, a total of sixteen vertical signal lines are wired for each column of the effective pixel areas 340. The effective pixel blocks 350 in the first and second rows from the top are connected to the fourth vertical signal line from the left in the corresponding column, where a predetermined direction parallel to the horizontal direction is a left direction. Furthermore, the effective pixel blocks 350 in the third and fourth rows from the top are connected to the third vertical signal line from the left in the corresponding column. Furthermore, the effective pixel blocks 350 in the fifth and sixth rows from the top are connected to the second vertical signal line from the left in the corresponding column, and the effective pixel blocks 350 in the seventh and eighth rows from the top are connected to the first vertical signal line from the left in the corresponding column.

Furthermore, any one of the light shielding pixel blocks 330 in the light shielding area 320 is connected to the logic chip 202 via one signal line.

Each of the multiplexers 311 is provided with four input terminals and two output terminals. The four vertical signal lines in the corresponding column are connected to those input terminals. Furthermore, the output terminals are connected to the logic chip 202 via two signal lines. The multiplexer 311 selects two of the four vertical signal lines according to the control of the scanning circuit 220 and outputs analog signals from the two vertical signal lines to the logic chip 202.

Note that the numbers of pixel blocks in the effective pixel area 340 and the light shielding area 320 are not limited to thirty two and four.

[Configuration Example of Pixel Block]

Figure 6:
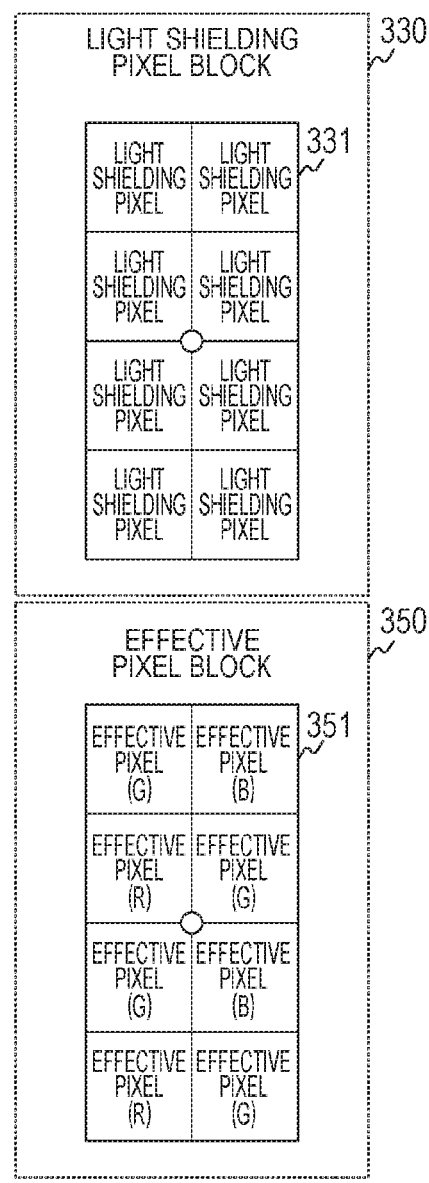
FIG. 6 is an example of a plan view of a light shielding pixel block and an effective pixel block according to the first embodiment of the present technology.

FIG. 6 is an example of a plan view of the light shielding pixel block 330 and the effective pixel block 350 according to the first embodiment of the present technology. In the light shielding pixel block 330, eight light shielding pixels 331 sharing a floating diffusion layer are arrayed in four rows×two columns. In the effective pixel block 350, eight effective pixels 351 sharing a floating diffusion layer are arrayed in four rows×two columns in a Bayer array. In the Bayer array, red (R) effective pixels 351 that photoelectrically convert red light, green (G) effective pixels 351 that photoelectrically convert green light, and blue (B) effective pixels 351 that photoelectrically convert blue light are arrayed. The effective pixel 351 and the light shielding pixel 331 have a square shape, for example, and all the pixels have the same size.

Furthermore, since the number of effective pixel blocks 350 per effective pixel area 340 is thirty two, 32×8 effective pixels 351 are arrayed for each effective pixel area 340.

The effective pixel 351 generates an analog signal according to an amount of received light as an effective pixel signal, using a power supply from a power supply line. The light shielding pixel 331 generates an analog signal including a noise component generated in the power supply line as a correction signal. Note that the light shielding pixel 331 is an example of a correction signal generation unit described in the claims.

The scanning circuit 220 illustrated in FIG. 4 performs scanning by simultaneously selecting and driving sixteen effective pixels 351 out of 32×8 effective pixels 351 in each of the N-column effective pixel areas 340. Furthermore, at the same time, the scanning circuit 220 selects and drives one light shielding pixel 331 for each of the light shielding area 320 and the light shielding area 380. By performing the scanning by driving the sixteen effective pixels 351 sixteen times, 32×8 effective pixel signals are read in each of the N-column effective pixel areas 340. By performing this processing M times, all the effective pixel signals are read and one piece of image data is generated.

Furthermore, the scanning circuit 220 outputs eight effective pixel signals out of the sixteen driven effective pixel signal in each scanning from the selection unit 310 to the logic chip 202 and outputs the remaining effective pixel signals from the selection unit 390 to the logic chip 202. Since the correction signal from the light shielding area 320 is also output to the logic chip 202, the selection unit 310 outputs nine analog signals including the eight effective pixel signals and the one correction signal. Similarly, nine analog signals are output from the selection unit 390.

Note that the number of pixels in the effective pixel block 350 and the light shielding pixel block 330 is not limited to eight.

Figure 7:
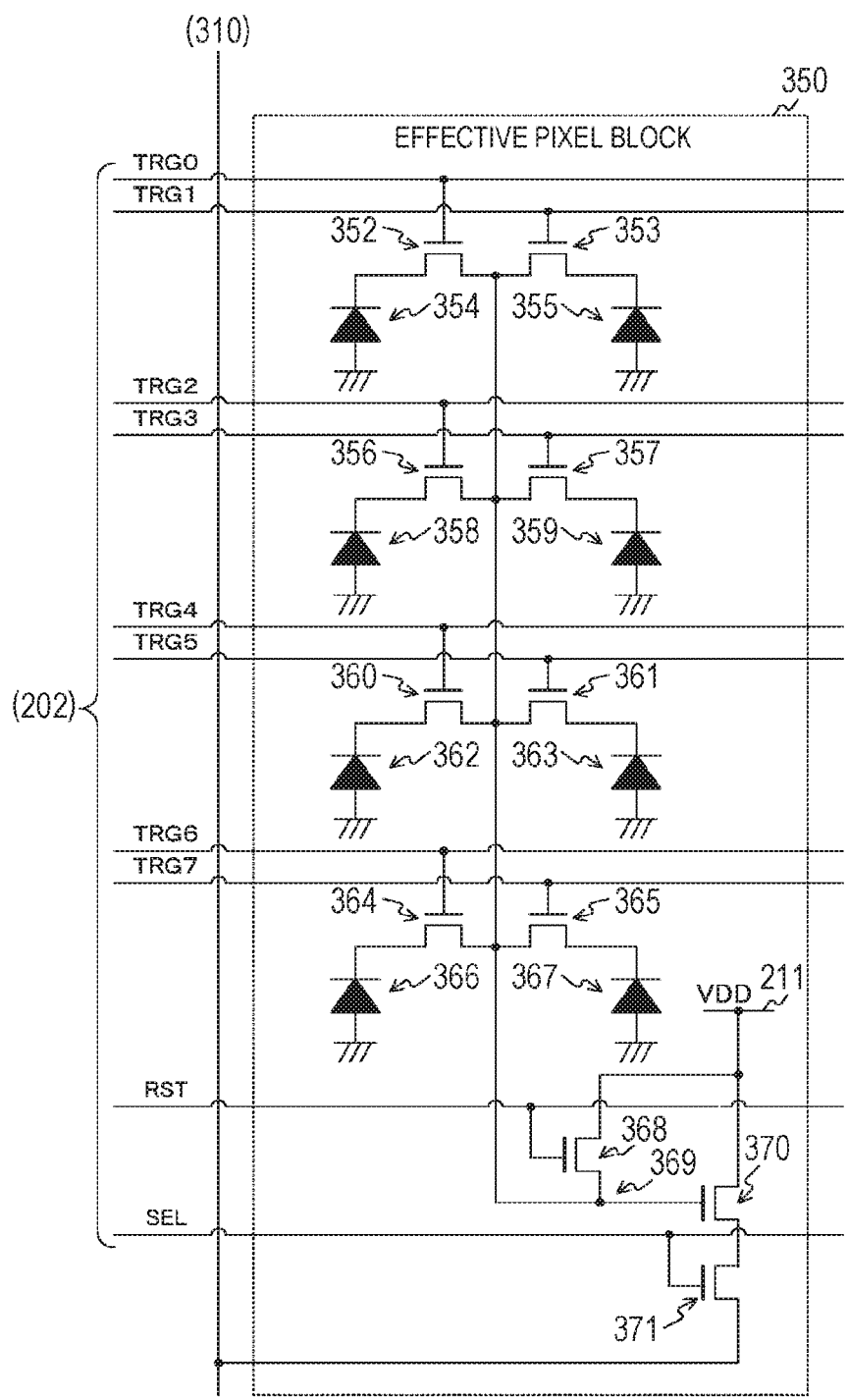
FIG. 7 is an example of a circuit diagram of an effective pixel block according to the first embodiment of the present technology.

FIG. 7 is an example of a circuit diagram of an effective pixel block 350 according to the first embodiment of the present technology. The effective pixel block 350 includes selection transistors 352, 353, 356, 357, 360, 361, 364, and 365, and photodiodes 354, 355, 358, 359, 362, 363, 366, and 367. Furthermore, the effective pixel block 350 includes a reset transistor 368, a floating diffusion layer 369, an amplification transistor 370, and a selection transistor 371. An N-type metal-oxide-semiconductor (MOS) transistor is used, for example, as transistors of the selection transistors 352 and the like. Note that the circuit configuration of the light shielding pixel block 330 is similar to that of the effective pixel block 350.

Each of the photodiodes 354, 355, 358, 359, 362, 363, 366, and 367 photoelectrically converts received light to generate charges.

The selection transistor 352 transfers the charge from the photodiode 354 to the floating diffusion layer 369 according to a transfer signal TRG0 from the scanning circuit 220 in the logic chip 202. The selection transistor 353 transfers the charge from the photodiode 355 to the floating diffusion layer 369 according to a transfer signal TRG1 from the scanning circuit 220.

The selection transistor 356 transfers the charge from the photodiode 358 to the floating diffusion layer 369 according to a transfer signal TRG2 from the scanning circuit 220. The selection transistor 357 transfers the charge from the photodiode 359 to the floating diffusion layer 369 according to a transfer signal TRG3 from the scanning circuit 220.

Furthermore, the selection transistor 360 transfers the charge from the photodiode 362 to the floating diffusion layer 369 according to a transfer signal TRG4 from the scanning circuit 220. The selection transistor 361 transfers the charge from the photodiode 363 to the floating diffusion layer 369 according to a transfer signal TRG5 from the scanning circuit 220.

The selection transistor 364 transfers the charge from the photodiode 366 to the floating diffusion layer 369 according to a transfer signal TRG6 from the scanning circuit 220. The selection transistor 365 transfers the charge from the photodiode 367 to the floating diffusion layer 369 according to a transfer signal TRG7 from the scanning circuit 220.

The floating diffusion layer 369 stores the transferred charges and generates a voltage according to the amount of stored charges. The reset transistor 368 extracts the charge from the floating diffusion layer 369 according to a reset signal RST from the scanning circuit 220 and initializes the charge amount. The amplification transistor 370 amplifies the voltage of the floating diffusion layer 369. The selection transistor 371 outputs an amplified voltage signal as an effective pixel signal to the selection unit 310 and the like via the vertical signal line according to a selection signal SEL from the scanning circuit 220.

The eight effective pixels 351 share one floating diffusion layer 369, and such pixels are called floating diffusion (FD) sharing-type pixels. Note that the number of pixels sharing the FD is not limited to eight. Furthermore, a pixel not sharing an FD can be arranged as the effective pixel 351.

[Configuration Example of AD Conversion Unit]

Figure 8:
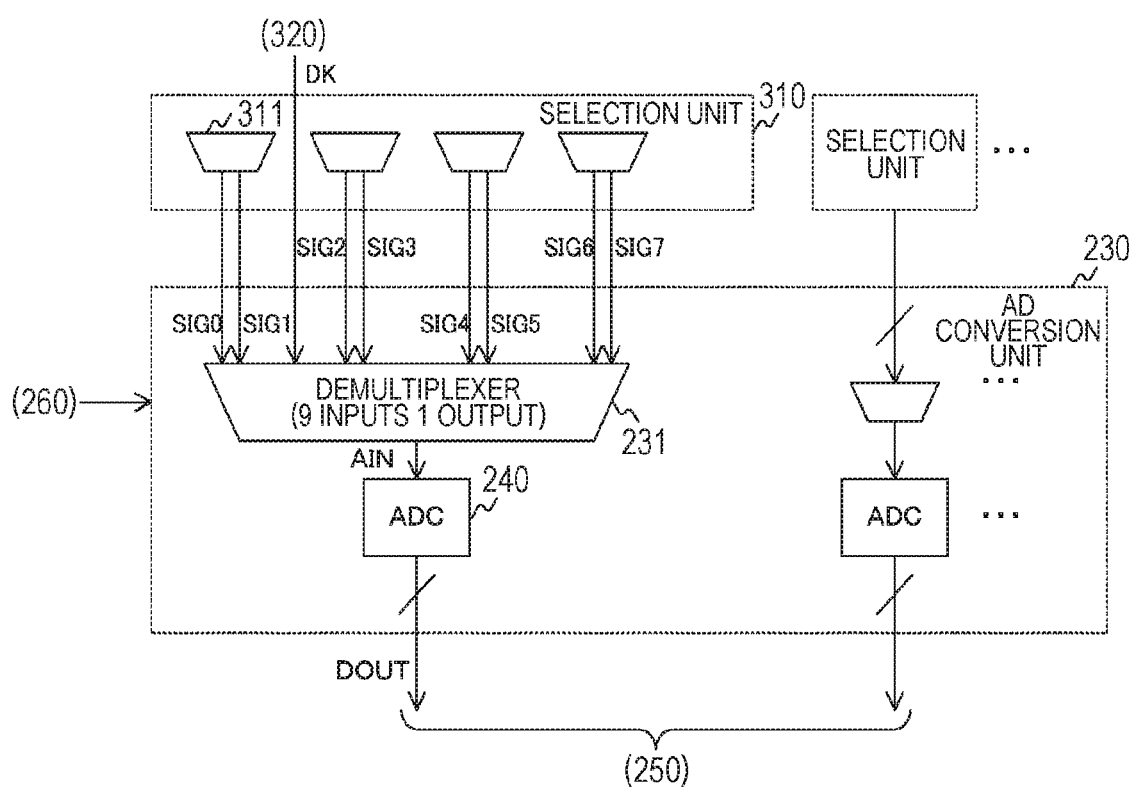
FIG. 8 is a block diagram illustrating a configuration example of an AD conversion unit according to the first embodiment of the present technology.

FIG. 8 is a block diagram illustrating a configuration example of the AD conversion unit 230 according to the first embodiment of the present technology. The AD conversion unit 230 includes a multiplexer 231 and an ADC 240 for each of the selection units 310. Since the number of selection units 310 is N, N multiplexers 231 and N ADCs 240 are arranged.

The multiplexer 231 receives nine signals including effective pixel signals SIG0 to SIG7 from the selection unit 310 and a correction signal DK from the light shielding area 320. Then, the multiplexer 231 sequentially selects the nine signals according to the control of the timing control unit 260 and inputs the signals to the ADC 240 as analog signals AIN. Note that the multiplexer 231 is an example of a selection circuit described in the claims.

The ADC 240 converts the analog signal AIN into a digital signal DOUT and outputs the digital signal DOUT to the signal processing unit 250.

[Configuration Example of ADC]

Figure 9:
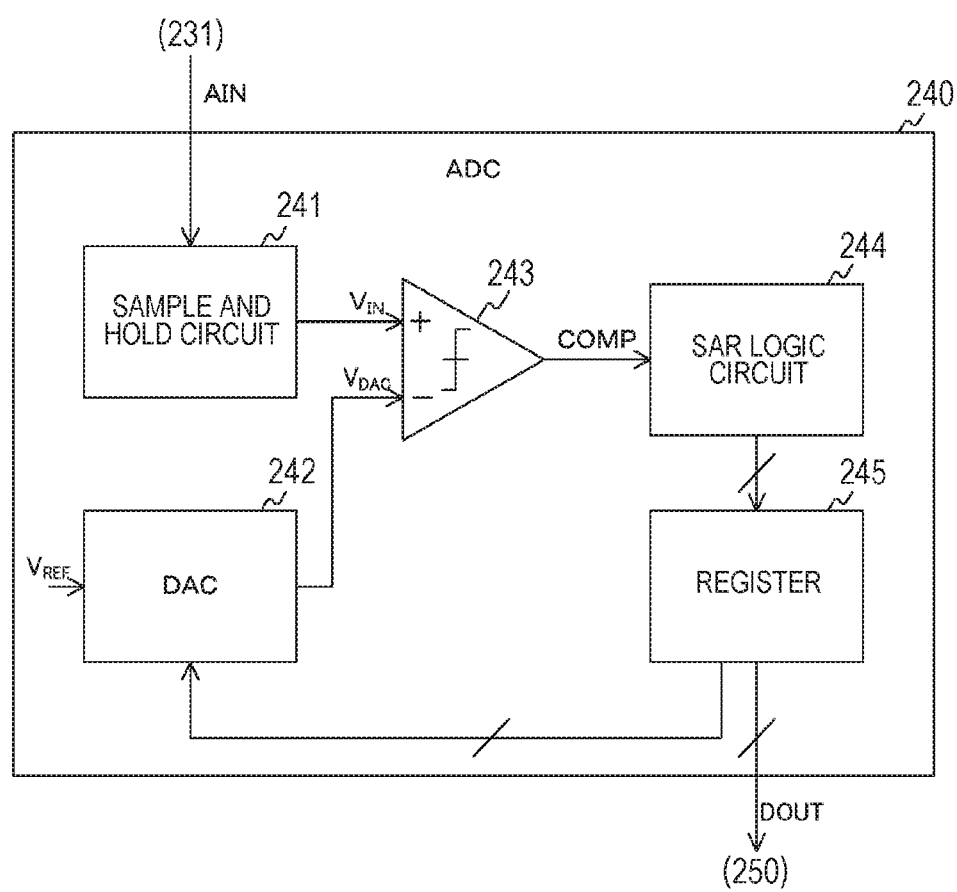
FIG. 9 is a block diagram illustrating a configuration example of an ADC according to the first embodiment of the present technology.

FIG. 9 is a block diagram illustrating a configuration example of the ADC 240 according to the first embodiment of the present technology. The ADC 240 includes a sample and hold circuit 241, a digital to analog converter (DAC) 242, a comparator 243, a successive approximation register (SAR) logic circuit 244, and a register 245.

The sample and hold circuit 241 samples and holds the analog signal AIN. The sample and hold circuit 241 inputs a voltage of the held signal as an input voltage $V_{IN}$ to a non-inverting input terminal (+) of the comparator 243.

The DAC 242 generates a DAC output voltage $V_{DAC}$ by digital to analog (DA) conversion for the digital signal from the register 245. The DAC 242 inputs the DAC output voltage $V_{DAC}$ to an inverting input terminal (−) of the comparator 243.

The comparator 243 compares the input voltage $V_{IN}$ with the DAC output voltage $V_{DAC}$. The comparator 243 supplies a comparison result to the SAR logic circuit 244 as a comparison result COMP.

The SAR logic circuit 244 updates a held value in the register 245 such that the input voltage $V_{IN}$ and the DAC output voltage $V_{DAC}$ are approximated on the basis of the sequentially compared comparison result COMP. The register 245 holds M-bit (M is an integer) data.

In an initial state, the register 245 is set to an intermediate scale, for example, and the DAC output voltage $V_{DAC}$ is set to $V_{REF}/2$ where a predetermined reference voltage is $V_{REF}$. Then, the comparator 243 first compares the input voltage $V_{IN}$ with the $V_{REF}/2$ DAC output voltage $V_{DAC}$. In a case where the input voltage $V_{IN}$ is higher than the DAC output voltage $V_{DAC}$, for example, the comparator 243 outputs the high-level comparison result COMP, and the SAR logic circuit 244 sets most significant bit (MSB) of the register 245 to "1". Then, the DAC output voltage $V_{DAC}$ rises by $V_{REF}/4$.

Meanwhile, in a case where the input voltage $V_{IN}$ is equal to or lower than the DAC output voltage $V_{DAC}$, the comparator 243 outputs the low-level comparison result COMP, and the SAR logic circuit 244 sets the MSB of the register 245 to "0". Then, the DAC output voltage $V_{DAC}$ drops by $V_{REF}/4$.

The comparator 243 performs the next comparison, and the SAR logic circuit 244 updates the next digit of the MSB on the basis of the next comparison result COMP. Thereafter, a similar procedure is continued until least significant bit/byte (LSB). Then, the register 245 outputs the held digital signal to the signal processing unit 250 as the digital signal DOUT. As a result, the analog signal AIN (effective pixel signal or correction signal) is AD-converted into the digital signal DOUT. Hereinafter, the digital signal obtained by AD-converting the effective pixel signal is referred to as "effective pixel data", and the digital signal obtained by AD-converting the correction signal is referred to as "correction data".

As described above, the ADC 240 that performs comparison in order from the MSB is called successive approximation register analog to digital converter (SARADC). Meanwhile, an ADC that compares a saw-shaped ramp signal and the analog signal AIN and measures the time until the comparison result is inverted is called gradient-type ADC. An AD conversion speed of the gradient-type ADC is slower than that of the SARADC and is often used in a solid-state image sensor. Then, in the solid-state image sensor using the gradient-type ADC, the gradient-type ADC is arranged for each of the effective pixel signal and the correction signal, and the effective pixel signal and the correction signal are AD-converted in parallel.

In contrast, the solid-state image sensor 200 sequentially selects the effective pixel signal and the correction signal and performs the AD conversion, and thus has a larger number of times of AD conversion per unit time than the case of performing AD conversion in parallel. For this reason, if the gradient-type ADC is applied to the solid-state image sensor 200, the time required for the AD conversion becomes long and may not be completed within an allowable time.

Therefore, the solid-state image sensor 200 uses an SARADC having a higher conversion speed than the gradient-type ADC to suppress an influence of the increase in the number of conversion times. Note that the solid-state image sensor 200 can use an ADC other than the SARADC as long as the ADC has a high conversion speed. For example, a delta sigma-type ADC, a cyclic-type ADC, or a pipeline-type ADC can be used instead of the SARADC.

[Configuration Example of Multiplexer]

Figure 10:
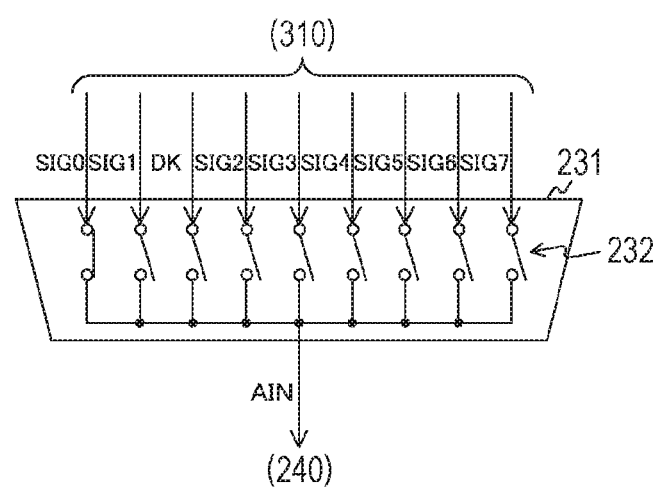
FIG. 10 is an example of a circuit diagram of a multiplexer according to the first embodiment of the present technology.

FIG. 10 is an example of a circuit diagram of the multiplexer 231 according to the first embodiment of the present technology. The multiplexer 231 includes nine switches 232. The effective pixel signals SIG0 to SIG7 are input to one ends of eight switches 232 out of the nine switches 232. Furthermore, the correction signal DK is input to one end of the remaining one switch 232. Then, the other ends of the switches 232 are connected in common to an output terminal of the multiplexer 231. The switch 232 outputs a corresponding analog signal to the output terminal of the multiplexer 231 according to the control of the timing control unit 260. Note that, although the nine-input and one-output multiplexer is arranged, the configuration is not limited thereto. A five-input and one-output multiplexer, an eleven-input and one-output multiplexer, or the like can also be arranged. In the case of using the five-input and one-output multiplexer, the effective pixel signals SIG0 to SIG3 and the correction signal DK are input, for example. Furthermore, in the case of using the eleven-input and one-output multiplexer, the effective pixel signals SIG0 to SIG9 and the correction signal DK are input, for example.

[Configuration Example of Signal Processing Unit]

Figure 11:
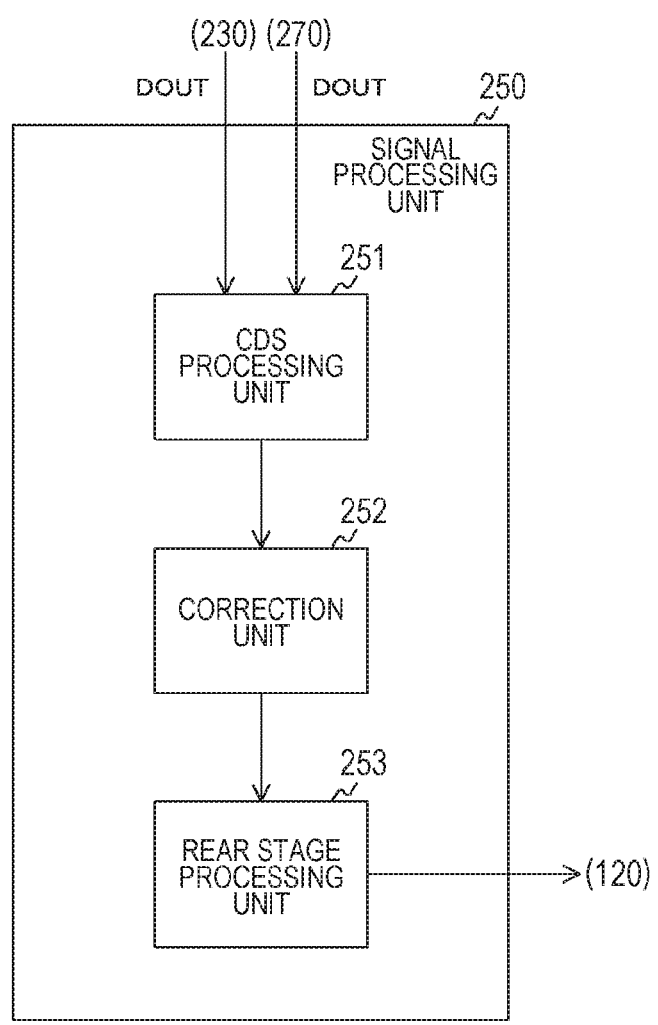
FIG. 11 is a block diagram illustrating a configuration example of a signal processing unit according to the first embodiment of the present technology.

FIG. 11 is a block diagram illustrating a configuration example of the signal processing unit 250 according to the first embodiment of the present technology. The signal processing unit 250 includes a correlated double sampling (CDS) processing unit 251, a correction unit 252, and a rear stage processing unit 253.

The CDS processing unit 251 performs CDS processing for the digital signals DOUT (effective pixel data or correction data) from each of the AD conversion units 230 and 270. The CDS processing unit 251 supplies a signal after the CDS processing to the correction unit 252.

The correction unit 252 corrects the effective pixel data on the basis of the correction data. Each of the selection units 310 and 390 outputs eight effective pixel signals and one correction signal. Since N selection units 310 and N selection units 390 are arranged, the total number of the effective pixel signals that are driven simultaneously is 16×N, and the total number of the correction signals is 2×N. These signals are sequentially AD-converted and undergo the CDS processing, and 16×N effective pixel data and 2×N correction data are input to the correction unit 252. For example, the correction unit 252 calculates a statistic amount (average value, median value, or the like) of the 2×N correction data as a correction value, and subtracts the correction value from each piece of the effective pixel data. Thereby, noise due to streaking or voltage fluctuation can be suppressed.

As described above, since the light shielding pixels 331 are arranged above and below the effective pixels 351 in the vertical direction, streaking in the vertical direction is particularly suppressed. Note that light shielding pixels 331 may be further arranged on the left and right of the effective pixels 351 in the horizontal direction, and the correction unit 252 may perform correction in the horizontal direction. Thereby, streaking in the horizontal direction can also be suppressed. Furthermore, the light shielding pixels 331 may be arranged only on the left and right of the effective pixels 351 in the horizontal direction, and the correction unit 252 may perform only the correction in the horizontal direction.

The rear stage processing unit 253 executes various types of rear stage processing as necessary. For example, contrast of the image data is obtained, and contrast auto focus (AF) processing for detecting a focal point is executed on the basis of the contrast as necessary. The rear stage processing unit 253 supplies the processed effective pixel data to the image processing unit 120. This method of detecting the focal point from the contrast is called contrast AF method.

FIG. 12 is a diagram illustrating an example of a signal selection order according to the first embodiment of the present technology. The N ADCs 240 are arranged in the solid-state image sensor 200, and these ADCs 240 are divided into a plurality of groups including nine adjacent ADCs 240. Since the total number of the ADCs 240 is N, the number of groups is N/9. Since the multiplexer 231 is arranged for each ADC 240, the multiplexers 231 are similarly divided into N/9 groups.

In each group, the timing control unit 260 sequentially selects nine multiplexers 231 in a predetermined order and causes the nine multiplexers 231 to output the correction signals DK, and causes the remaining multiplexers 231 to output the effective pixel signals SIG. For example, in 9kth-time (k is an integer) AD conversion, the timing control unit 260 selects the 0th multiplexer 231 in the group and causes the 0th ADC 240 to output the correction signal DK. Meanwhile, the timing control unit 260 controls another multiplexer 231 and causes the corresponding ADC 240 to output the effective pixel signal SIG0.

In (9k+1)st-time AD conversion, the timing control unit 260 causes the first ADC 240 in the group to output the correction signal DK, and causes the remaining ADCs 240 to output the effective pixel signals SIG0 or SIG1. In (9k+2)nd-time AD conversion, the timing control unit 260 causes the second ADC 240 in the group to output the correction signal DK, and causes the remaining ADCs 240 to output the effective pixel signals SIG1 or SIG2.

Thereafter, the ADCs 240 for converting the correction signal DK are similarly shifted one by one, in (9k+8)th-time AD conversion, the timing control unit 260 causes the eighth ADC 240 in the group to output the correction signal DK, and causes the remaining ADCs 240 to output the effective pixel signals SIG7.

By shifting the ADCs 240, which are output destinations of the correction signal DK, one by one in this way, the signal processing unit 250 can acquire the correction data without interruption every time AD conversion is performed. Thereby, the accuracy of correction can be improved.

Note that the timing control unit 260 sequentially selects the multiplexers 231 that output the correction signal DK in a predetermined order but the timing control unit 260 can also randomly select the multiplexers 231 as illustrated in FIG. 13. In this case, the timing control unit 260 generates a random number indicating any one of the nine multiplexers 231, selects the multiplexer 231 according to the random number, and causes the multiplexer 231 to output the correction signal DK in the 9kth-time AD conversion. In the (9k+1)st-time AD conversion, the timing control unit 260 generates a random number indicating any one of the eight multiplexers 231 except the selected multiplexer 231, selects the multiplexer 231 according to the random number, and causes the multiplexer 231 to output the correction signal DK. In the (9k+2)nd-time AD conversion, the timing control unit 260 generates a random number indicating any one of the seven multiplexers 231 except the selected multiplexers 231, selects the multiplexer 231 according to the random number, and causes the multiplexer 231 to output the correction signal DK. Hereinafter, a similar procedure is repeated, and in the (9k+8)th-time AD conversion, the timing control unit 260 causes the multiplexer 231 that has not been selected from the 9kth-time to (9k+7)th-time AD conversion to output the correction signal DK. Furthermore, the timing control unit 260 may cause the correction signal DK to be further periodically output at timing not including a high-luminance signal, as illustrated in FIG. 14. In this case, at the 10kth-time, the timing control unit 260 causes all the multiplexers 231 to output the correction signal DK. Then, in the (10k+1)st to (10k+9)th times, the ADCs 240 that are output destinations of the correction signal DK are shifted one by one. Since a streaking component is not mixed at the 10kth-time, pure streaking amount observation can be further stabilized by using the correction signal DK at this timing. Furthermore, in the (10k+1)st to (10k+9)th times, the streaking amount that is generated by being affected by the high-luminance signal can be observed using the correction signal DK and the effective pixel signal.

Figure 15:
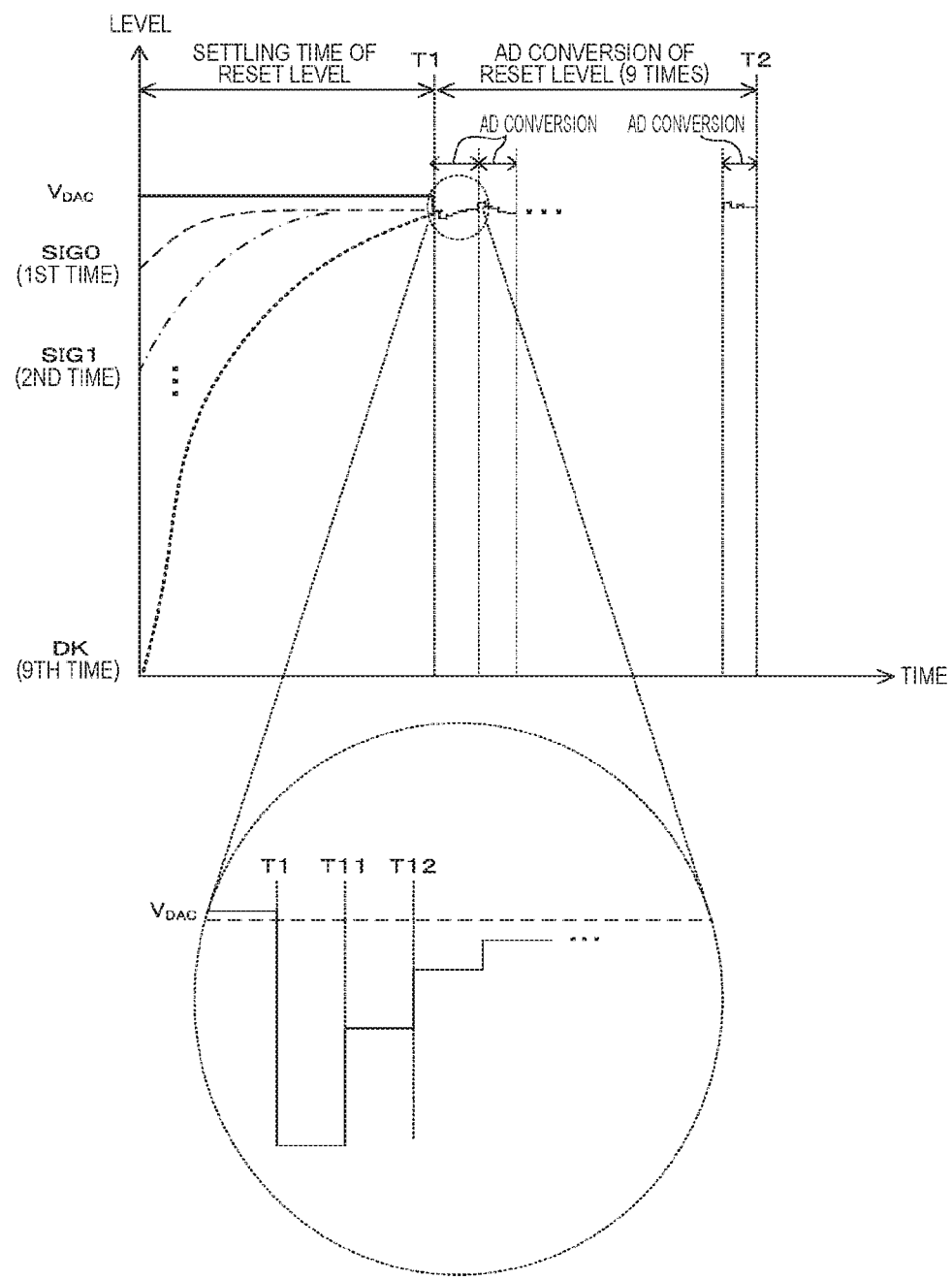
FIG. 15 is a timing chart illustrating an example of a reset level AD conversion operation according to the first embodiment of the present technology.

FIG. 15 is a timing chart illustrating an example of a reset level AD conversion operation according to the first embodiment of the present technology. The scanning circuit 220 supplies the reset signal RST to sixteen effective pixels 351 and two light shielding pixels 331 for each effective pixel area 340. Among the pixels, the effective pixel signals from eight pixels and one correction signal are output to the upper selection unit 310, and the remaining signals are output to the lower selection unit 310. The level of the effective pixel signal and the light shielding pixel signal at the time of reset is called "reset level". In FIG. 15, the solid line indicates the DAC output voltage $V_{DAC}$, and the rough dotted line indicates the first reset level of the effective pixel signal SIG0 and the like. The alternate long and short dash line indicates the second reset level of the effective pixel signal SIG2 and the like. The fine dotted line indicates the ninth reset level of the correction signal DK and the like.

During a period from timing T1 when a certain time until the reset level settles elapses to timing T2 thereafter, the timing control unit 260 controls the upper AD conversion unit 230 to sequentially select and AD-convert the nine reset levels. When the time required for each AD conversion is, for example, 57 nanoseconds (ns), 9×57 nanoseconds (ns) are required to complete the nine times of AD conversion. Meanwhile, the lower AD conversion unit 270 operates in parallel to perform AD conversion nine times.

At timing T1, the DAC output voltage $V_{DAC}$ is set to an initial value. In a period from timing T1 to timing T11, the ADC 240 updates the MSB on the basis of a comparison result between the DAC output voltage $V_{DAC}$ and the reset level. Since the reset level of the dotted line is higher than the DAC output voltage $V_{DAC}$ of the solid line, the DAC output voltage $V_{DAC}$ rises by $V_{REF}/4$. In the period from the timing T11 to timing T12, the ADC 240 updates the next digit of the MSB on the basis of the comparison result between the DAC output voltage $V_{DAC}$ and the reset level. Since the reset level is higher than the DAC output voltage $V_{DAC}$, the DAC output voltage $V_{DAC}$ rises by $V_{REF}/8$. Hereinafter, the sequential comparison is performed by a similar procedure.

Figure 16:
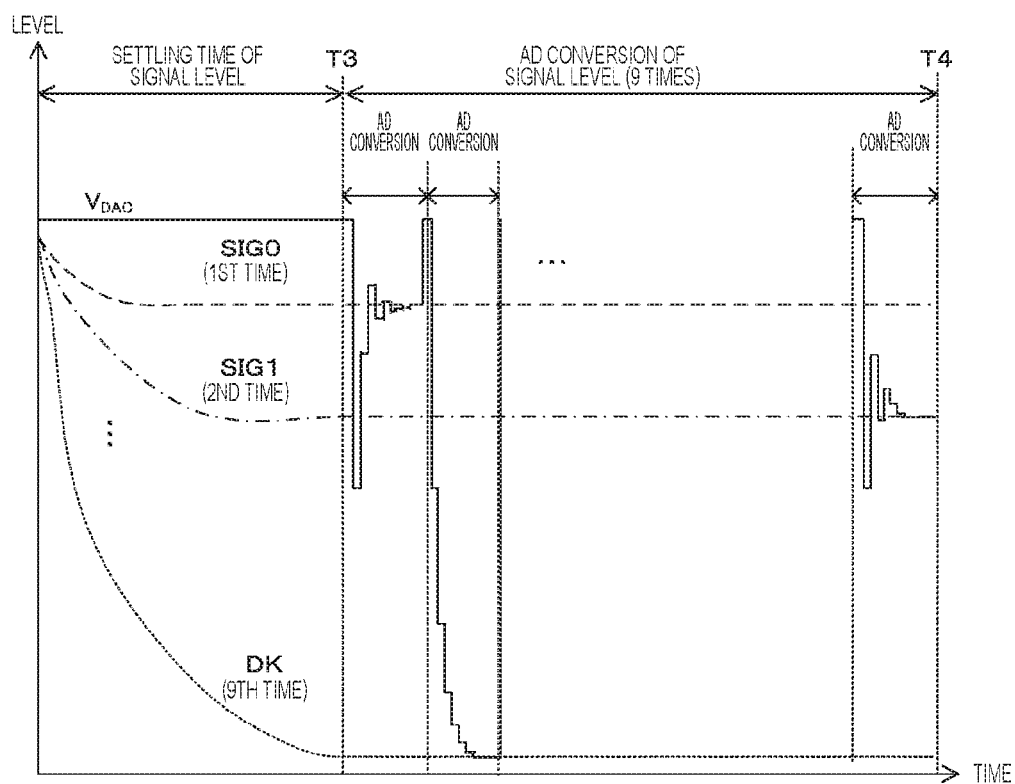
FIG. 16 is a timing chart illustrating an example of a signal level AD conversion operation according to the first embodiment of the present technology.

FIG. 16 is a timing chart illustrating an example of a signal level AD conversion operation according to the first embodiment of the present technology. The scanning circuit 220 transfers the charges from the photodiode 354 and the like according to the transfer signal TRG after the reset. The level of the effective pixel signal and the light shielding pixel signal after the transfer is called "signal level".

During a period from timing T3 when a certain time until the signal level settles elapses to timing T4 thereafter, the timing control unit 260 controls the upper AD conversion unit 230 to sequentially select and AD-convert nine signal levels. A value larger than the reset level is set as a bit depth of when the signal level is AD-converted. Therefore, one time of AD conversion of the signal level requires, for example, longer 83 nanoseconds (ns), and 9×83 nanoseconds (ns) are required to complete the nine times of AD conversion.

The subsequent CDS processing unit 251 obtains a difference between the reset level and the signal level of the effective pixel signal and sets the difference as net effective pixel data. Furthermore, the CDS processing unit 251 obtains a difference between the reset level and the signal level of the correction signal and sets the difference as net correction data.

Figure 17:
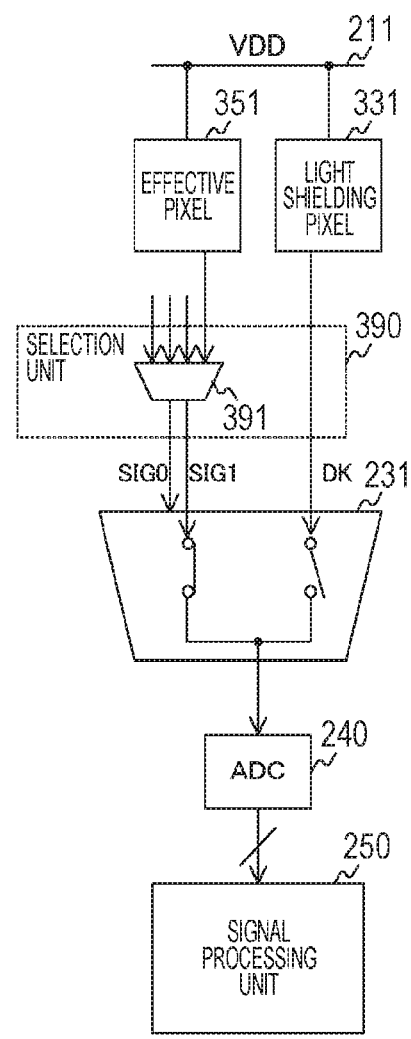
FIG. 17 is an example of an overall view of the solid-state image sensor according to the first embodiment of the present technology.

FIG. 17 is an example of an overall view of the solid-state image sensor 200 according to the first embodiment of the present technology. The effective pixel 351 generates an analog signal according to the amount of received light as the effective pixel signal using a power supply from a power supply line 211. Furthermore, the light shielding pixel 331 generates the correction signal including a noise component generated in the power supply line 211.

The multiplexer 231 sequentially selects the effective pixel signals (SIG1 and the like) and the correction signal DK and outputs the selected signals to the ADC 240. The ADC 240 performs AD conversion for the effective pixel signal and outputs the converted signal as the effective pixel data to the signal processing unit 250, and performs AD conversion for the correction signal and outputs the converted signal as the correction data. The signal processing unit 250 corrects the effective pixel data on the basis of the correction data.

[Operation Example of Solid-State Image Sensor]

Figure 18:
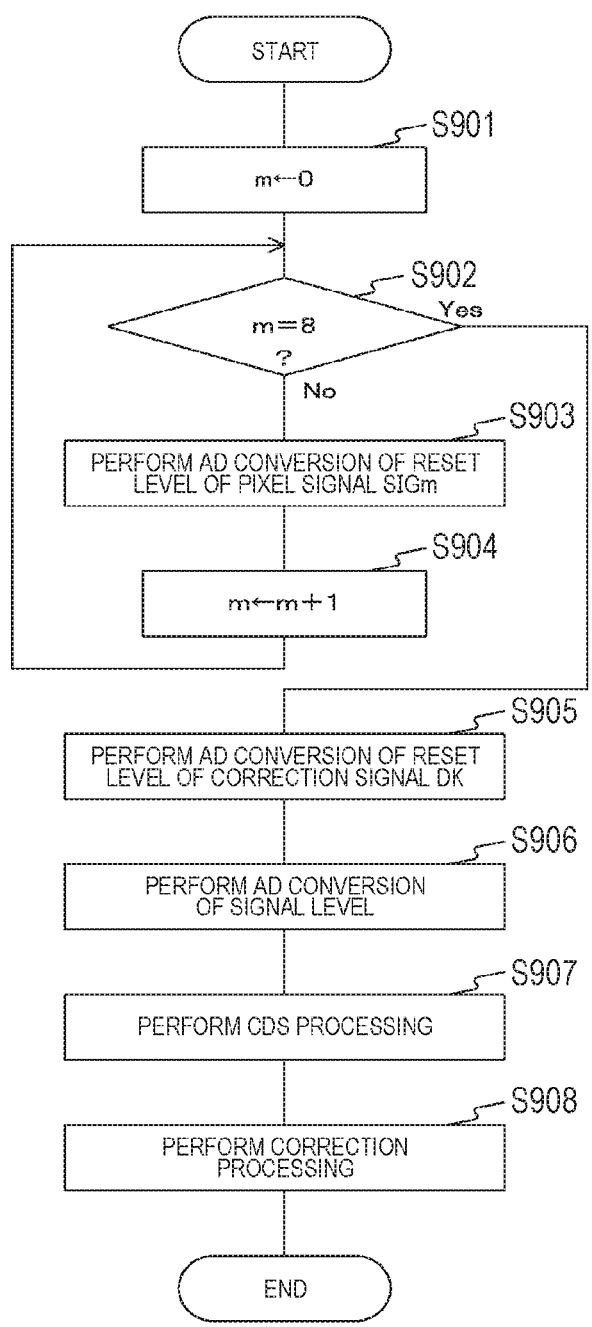
FIG. 18 is a flowchart illustrating an example of an operation of the solid-state image sensor according to the first embodiment of the present technology.

FIG. 18 is a flowchart illustrating an example of an operation of the solid-state image sensor 200 according to the first embodiment of the present technology. This operation is started when, for example, a predetermined application for imaging image data is executed.

The solid-state image sensor 200 initializes a variable m to "0" (step S901) and determines whether or not m is "8" (step S902). In a case where m is not "8" (step S902: No), the solid-state image sensor 200 performs AD conversion for the reset level of an effective pixel signal SIGm (step S903) and increments m (step S904). After step S904, the solid-state image sensor 200 repeats step S902 and the subsequent steps.

In a case where m is "8" (step S902: Yes), the solid-state image sensor 200 performs AD conversion for the reset level of the correction signal DK (step S905). Then, the solid-state image sensor 200 sequentially performs AD conversion for the signal levels of the effective pixel signals SIG0 to SIG7 and the correction signal DK (step S906). The solid-state image sensor 200 executes CDS processing (step S907) and performs correction processing for the effective pixel data on the basis of the correction data (step S908). After step S908, the solid-state image sensor 200 terminates the operation for reading a part of the effective pixel areas 340. One sheet of image data is read out by repeating steps S901 to S908 a certain number of times.

As described above, according to the first embodiment of the present technology, the AD conversion unit 230 sequentially selects and AD-converts the effective pixel signal and the correction signal. Therefore, the number of ADCs can be reduced as compared with the case of performing AD conversion for the effective pixel signal and the correction signal in parallel.

First Modification

In the above-described first embodiment, the effective pixels have been arrayed in the pixel array unit 210 in a Bayer array. However, since pixels of the same color are not adjacent in the Bayer array, the image quality may be deteriorated when pixel addition of a plurality of pieces of effective pixel data of the same color is performed. A pixel array unit 210 according to a first modification of the first embodiment is different from that of the first embodiment in that a plurality of effective pixels of the same color is arranged adjacent to one another.

Figure 19:
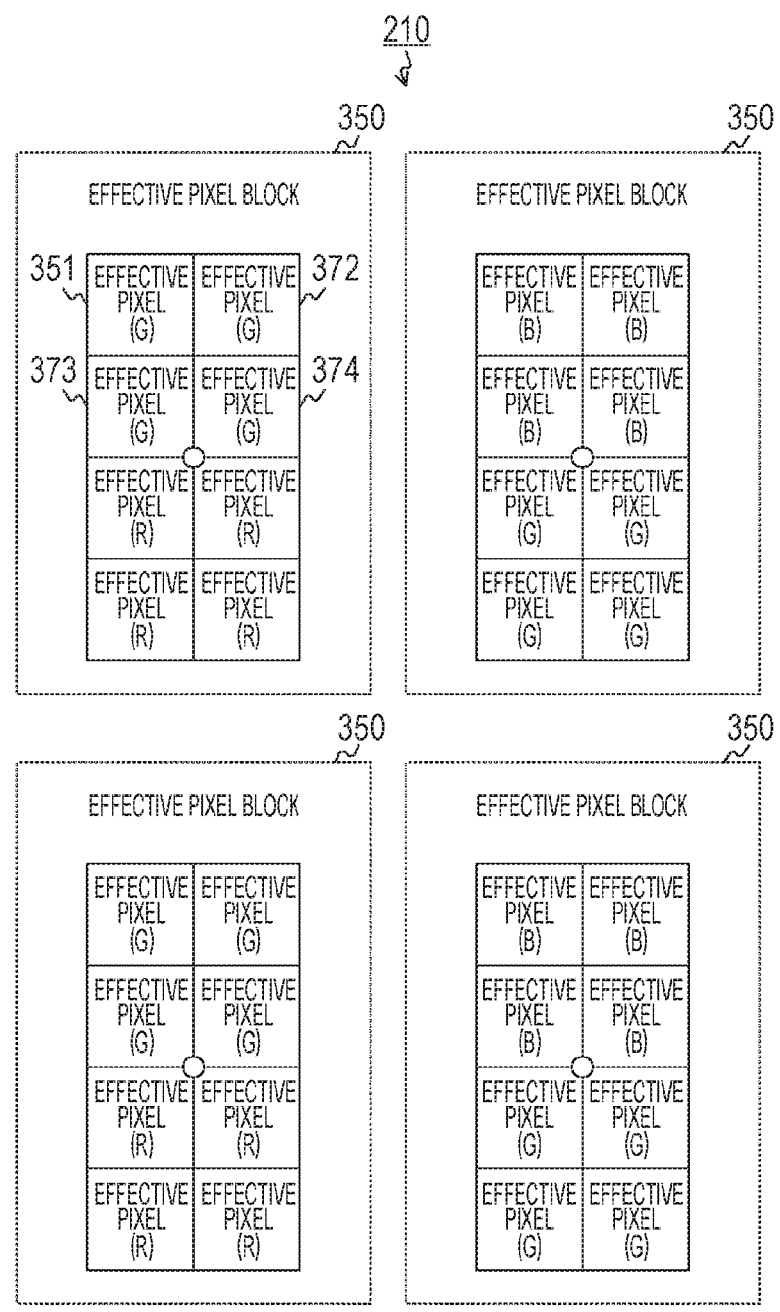
FIG. 19 is an example of a plan view of a pixel array unit according to a first modification of the first embodiment of the present technology.

FIG. 19 is an example of a plan view of the pixel array unit 210 according to the first modification of the first embodiment of the present technology. As illustrated in FIG. 19, in the first modification of the first embodiment, four effective pixels of the same color are arranged adjacent to one another. For example, a G effective pixel 351 is arranged at the upper left of the effective pixel block 350, and a G effective pixel 372 is arranged on the right side of the effective pixel 351. Furthermore, a G effective pixel 373 is arranged below the effective pixel 351, and a G effective pixel 374 is arranged on the right side of the effective pixel 373. In the effective pixel block 350, four R pixels are arranged in the remaining parts. In the effective pixel block 350 on the right side of the aforementioned effective pixel block 350, four B pixels and four G pixels are arranged.

The signal processing unit 250 performs pixel addition of the adjacent four pieces of effective pixel data of the same color in a pixel addition mode or the like.

Furthermore, the scanning circuit 220 sets half exposure time of the adjacent four pixels of the same color to a value different from the remaining exposure time in a mode of expanding a dynamic range. For example, the scanning circuit 220 exposes the effective pixel 351 and the lower right effective pixel 374 over an exposure time TS. Next, the scanning circuit 220 exposes the effective pixel 372 and the lower left effective pixel 373 over an exposure time TL that is longer than the exposure time TS. Then, the scanning circuit 220 combines the effective pixel data exposed with the exposure time TS and the effective pixel data exposed with the exposure time TL by alpha combination or the like. Thereby, the dynamic range can be expanded.

As described above, in the first embodiment of the present technology, the plurality of effective pixels of the same color is arranged adjacent to one another. Therefore, the image quality of the pixel-added image data can be improved as compared with the case of a Bayer array in which colors of adjacent pixels are different.

Second Modification

In the above-described first embodiment, the focal point has been detected using the contrast AF method. However, the contrast AF has a slower AF speed than a phase difference AF method. A solid-state image sensor 200 according to a second modification of the first embodiment is different from that of the first embodiment in detecting a focal point using a phase difference AF method.

Figure 20:
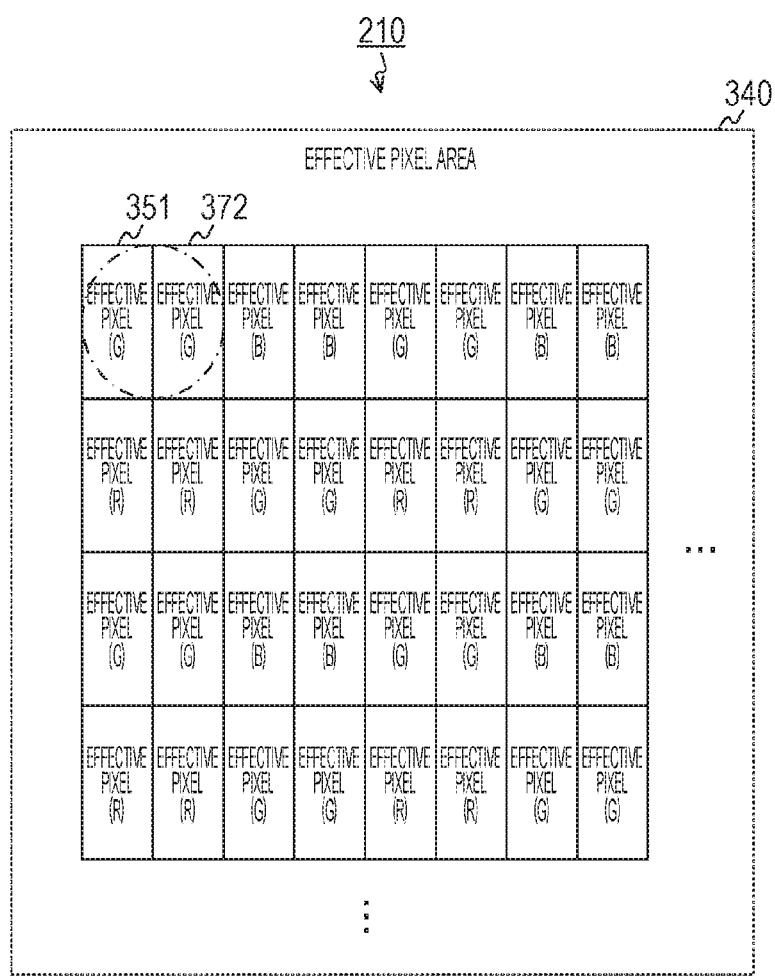
FIG. 20 is an example of a plan view of a pixel array unit according to a second modification of the first embodiment of the present technology.

FIG. 20 is an example of a plan view of a pixel array unit 210 according to the second modification of the first embodiment of the present technology. In the pixel array unit 210 of the second modification of the first embodiment, rectangular effective pixels are arrayed. In light shielding areas 320 and 380, rectangular light shielding pixels are also arrayed.

Furthermore, in the pixel array unit 210, a pair of effective pixels of the same color are arrayed adjacent to each other in the horizontal direction. For example, a G effective pixel 372 is arranged on the right side of a G effective pixel 351. A pair of B pixels are arrayed on the right side of the effective pixel 372. A pair of R pixels are arranged below the effective pixels 351 and 372, and two G pixels are arranged on the right side of the pair of R pixels.

Then, the same microlens is provided for a pair of adjacent effective pixels of the same color. The alternate long and short dash line in FIG. 19 represents the position of the microlens. One incident light of two pupil-divided images is input to one of the pair of effective pixels, and the other incident light of the two pupil-divided images is input to the other of the pair of effective pixels. The signal processing unit 250 obtains a phase difference between the two images from the effective pixel data, and executes phase difference AF processing for detecting a focal point from the phase difference.

As described above, in the second modification of the first embodiment of the present technology, the phase difference AF method is used. Therefore, the focal point can be detected at a higher speed than the case of using the contrast AF method.

Third Modification

In the above-described first embodiment, pixels having the same size have been arrayed in the pixel array unit 210. With this configuration, all the pixels have the same sensitivity, and the image data needs to be imaged a plurality of times while changing the exposure time to improve the dynamic range. A solid-state image sensor 200 according to a third modification of the first embodiment is different from that of the first embodiment in that a plurality of pixels having different sensitivities is arranged in a pixel array unit 210.

Figure 21:
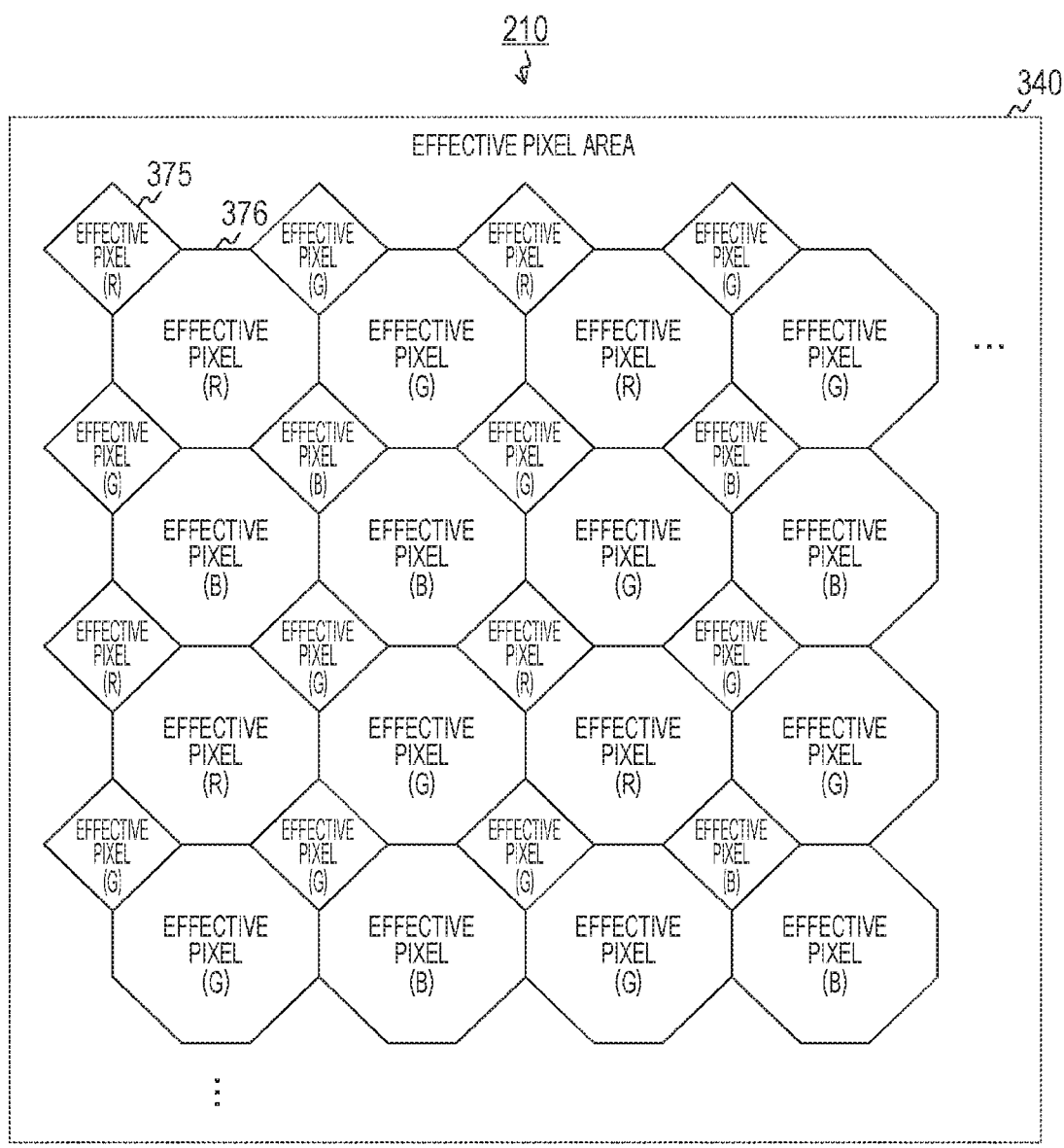
FIG. 21 is an example of a plan view of a pixel array unit according to a third modification of the first embodiment of the present technology.

FIG. 21 is an example of a plan view of the pixel array unit 210 according to the third modification of the first embodiment of the present technology. In the pixel array unit 210 of the third modification example of the first embodiment, effective pixels 375 and effective pixels 376 having different light receiving areas are arrayed. The shape of the effective pixel 375 is, for example, a rhombus, and the shape of the effective pixel 376 is, for example, an octagon. When the effective pixels 376 are arrayed, a rhombic gap is generated, and thus the effective pixels 375 are arranged in the gaps. When attention is paid only to the rhombic effective pixels 375, these pixels are arranged in a Bayer array. Furthermore, when attention is paid only to the octagonal effective pixels 376, these pixels are also arranged in a Bayer array. Similarly, in light shielding areas 320 and 380, the rhombic light shielding pixels and the octagonal light shielding pixels are arrayed.

Since the light receiving areas are different, the effective pixel 375 and the effective pixel 376 have different sensitivities. Therefore, the scanning circuit 220 exposes the effective pixels 375 and the effective pixels 376 with the same exposure time, and the signal processing unit 250 combines the effective pixel data of the same color, whereby the dynamic range can be expanded. As a result, it is not necessary to image image data a plurality of times while changing the exposure time.

As described above, according to the third modification of the first embodiment of the present technology, the effective pixels 375 and the effective pixels 376 having different light receiving areas are arrayed. Therefore, the dynamic range can be expanded by combining the effective pixel data.

Fourth Modification

In the above-described first embodiment, two ADCs have been arranged for each column of the effective pixel area 340 in which 32×8 effective pixels 351 are arrayed. However, the number of ADCs increases as the number of pixels increases. A solid-state image sensor 200 according to a fourth modification of the first embodiment is different from that of the first embodiment in that the number of ADCs is reduced to half.

Figure 22:
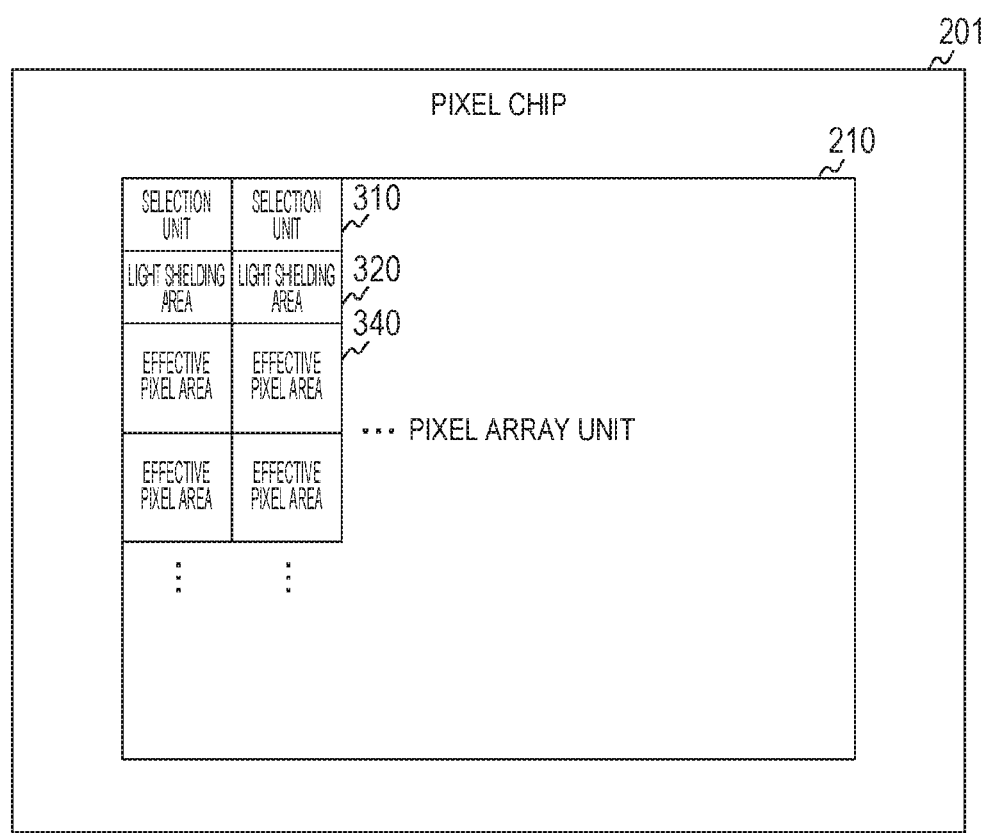
FIG. 22 is an example of a plan view of a pixel chip according to a fourth modification of the first embodiment of the present technology.

FIG. 22 is an example of a plan view of a pixel chip 201 according to a fourth modification of the first embodiment of the present technology. A pixel chip 201 according to the fourth modification of the first embodiment is different from that of the first embodiment in that no light shielding areas 380 and selection units 390 are arranged.

Figure 23:
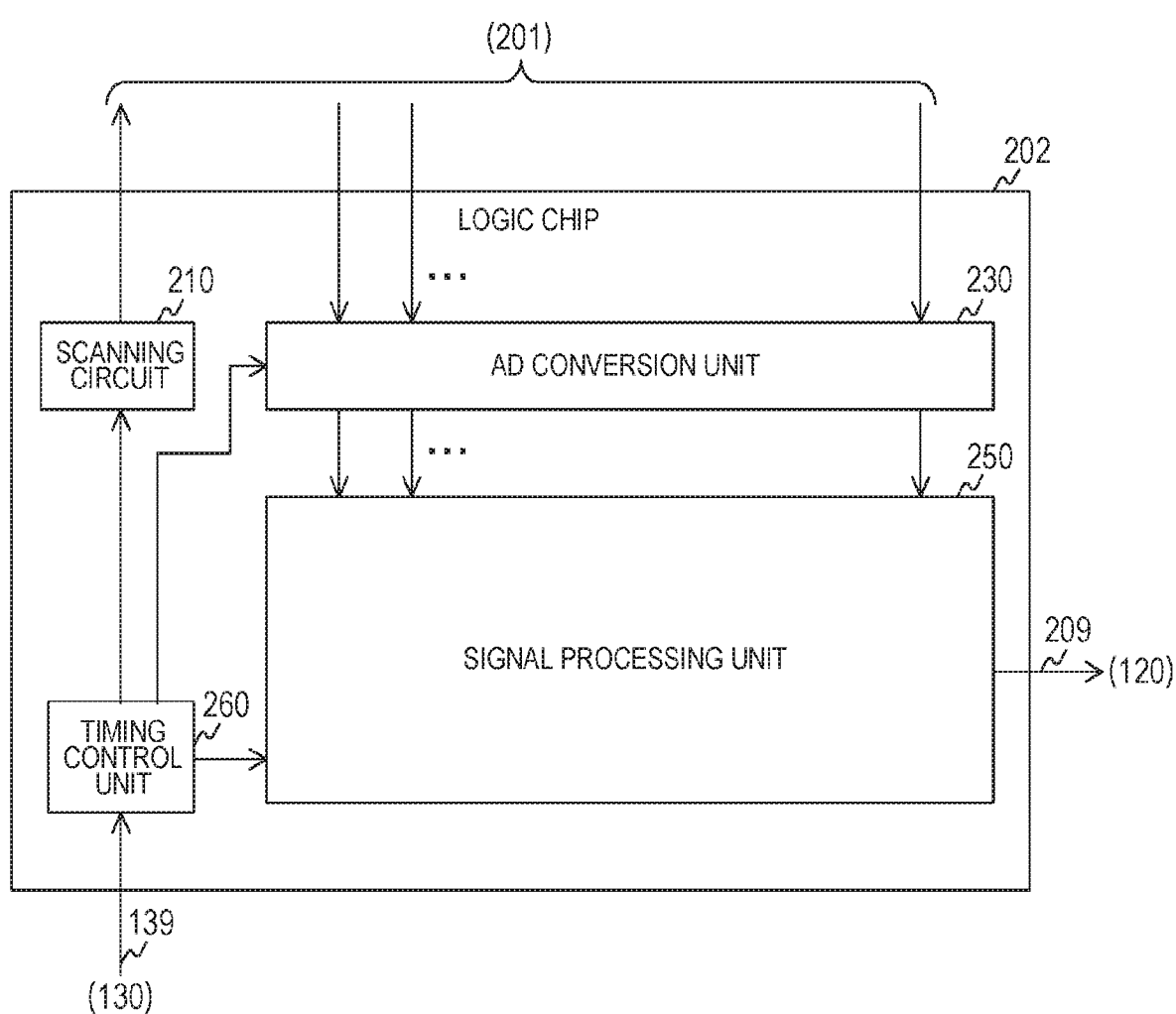
FIG. 23 is a block diagram illustrating a configuration example of a logic chip according to the fourth modification of the first embodiment of the present technology.

FIG. 23 is a block diagram illustrating a configuration example of a logic chip 202 according to the fourth modification of the first embodiment of the present technology. The logic chip 202 according to the fourth modification of the first embodiment is different from that of the first embodiment in that no AD conversion unit 270 is arranged. Although the number of ADCs is halved due to the reduction in the AD conversion unit 270, the number of effective pixel signals that can be simultaneously read by the scanning circuit 220 for each effective pixel area 340 is halved from 16 to 8.

As described above, according to the fourth modification example of the first embodiment of the present technology, the number of ADCs is reduced to half, and thus the mounting area of the logic chip 202 can be made small.

Second Embodiment

In the above-described first embodiment, the light shielding pixels have been arranged, and the effective pixel data has been corrected using the correction data from the light shielding pixels. However, in this configuration, the light shielding pixels need to be arranged in the pixel chip 201 in addition to the effective pixels. Therefore, when the size of the pixel chip 201 is constant, the arrangement area of the effective pixels becomes narrower than the case of arranging only the effective pixels. A solid-state image sensor 200 according to a second embodiment is different from that of the first embodiment in being provided with a high-pass filter that allows pass of a high-frequency component in a power supply signal from a power supply line 211, instead of light shielding pixels, and correcting effective pixel data using the high-frequency component.

Figure 24:
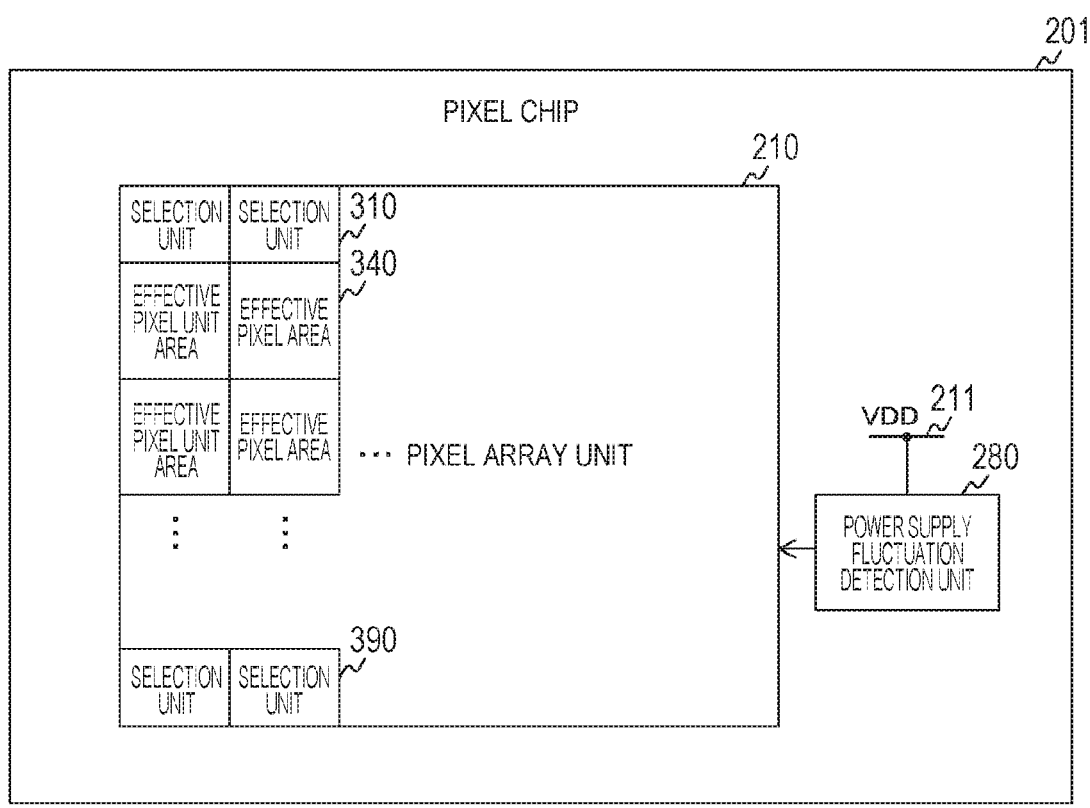
FIG. 24 is a plan view illustrating a configuration example of a pixel chip according to a second embodiment of the present technology.

FIG. 24 is a plan view illustrating a configuration example of a pixel chip 201 according to the second embodiment of the present technology. The pixel chip 201 according to the second embodiment is different from that of the first embodiment in that light shielding areas 320 and 380 are not arranged and a power supply fluctuation detection unit 280 is further arranged. The power supply fluctuation detection unit 280 detects the high-frequency component of the power supply signal as power supply fluctuation.

Figure 25:
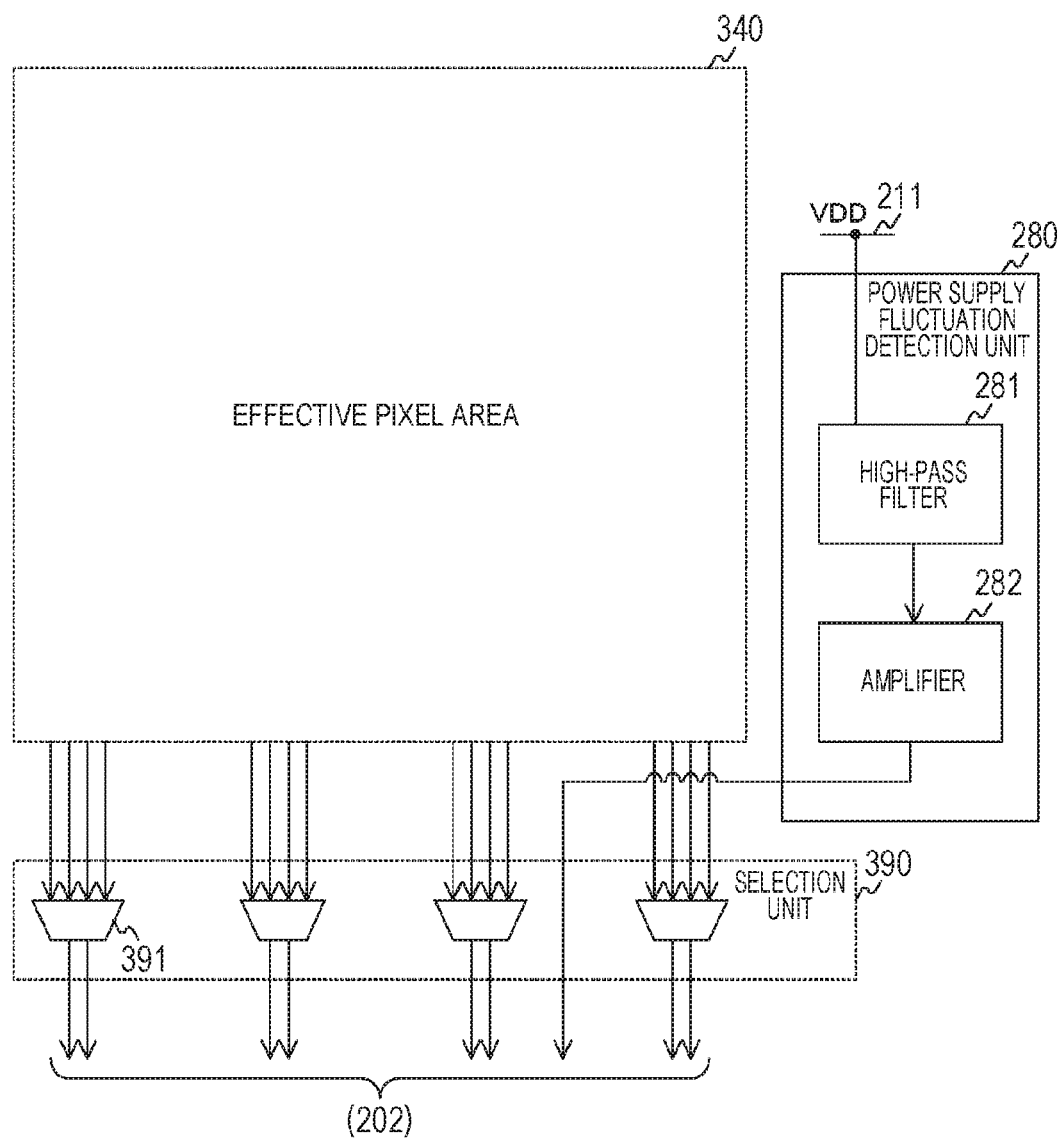
FIG. 25 is a block diagram illustrating a configuration example of a power supply fluctuation detection unit according to the second embodiment of the present technology.

FIG. 25 is a block diagram illustrating a configuration example of the power supply fluctuation detection unit 280 according to the second embodiment of the present technology. This power supply fluctuation detection unit 280 includes a high-pass filter 281 and an amplifier 282.

The high-pass filter 281 allows pass of a high-frequency component higher than a predetermined frequency in the power supply signal from the power supply line 211. The high-pass filter 281 supplies the high-frequency component to the amplifier 282 as a correction signal. The amplifier 282 amplifies the correction signal and supplies the amplified signal to selection units 310 and 390.

As described above, in the second embodiment of the present technology, the high-pass filter that allows pass of the high-frequency component of the power supply signal is provided instead of the light shielding pixels, and the signal processing unit 250 corrects the effective pixel data using the high-frequency component. Therefore, it is not necessary to provide the light shielding pixels. As a result, the number of effective pixels can be increased by the reduced number of light shielding pixels. Alternatively, the effective pixel size can be made large.

<3. Application Example to Mobile Bodies>

The technology according to the present disclosure (present technology) can be applied to various products. For example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

Figure 26:
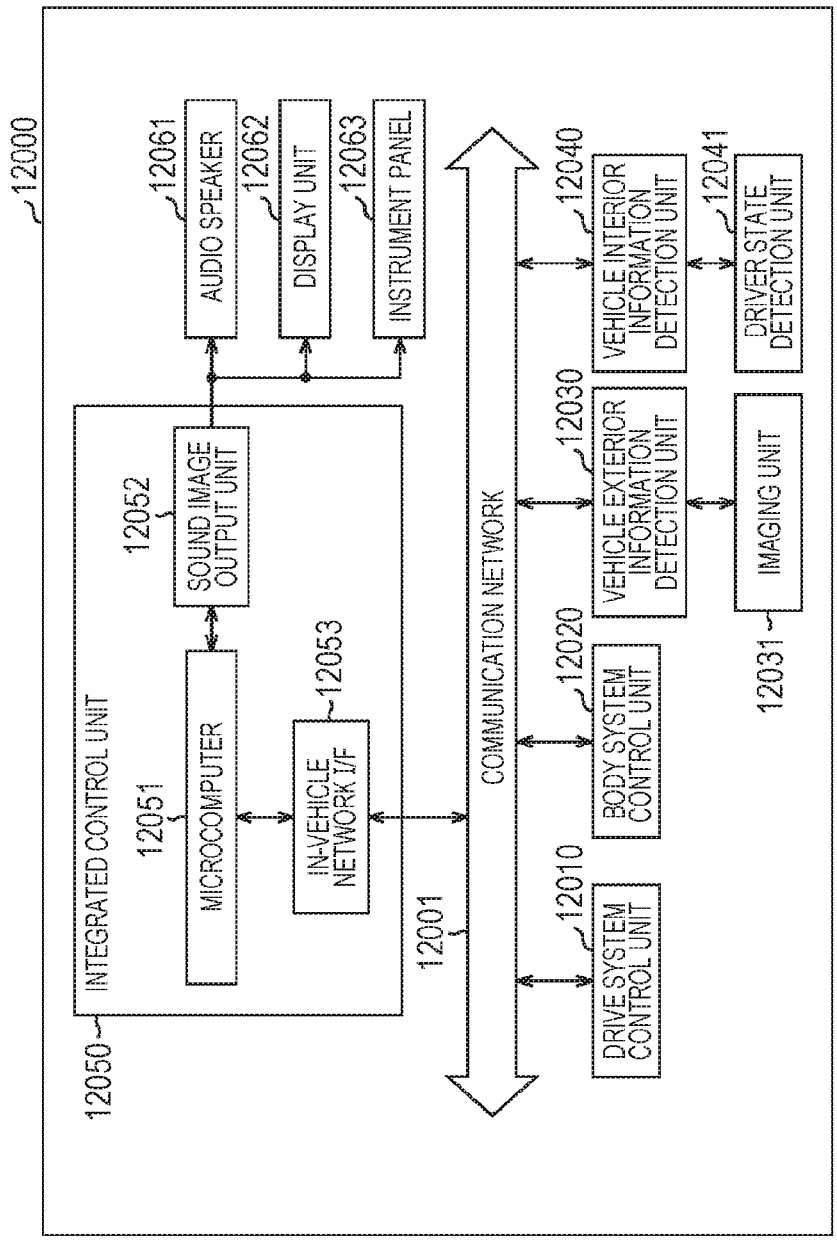
FIG. 26 is a block diagram illustrating a schematic configuration example of a vehicle control system.

FIG. 26 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 26, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of various devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like of the vehicle.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to the amount of received light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep on the basis of the detection information input from the driver state detection unit 12041.

The microcomputer 12051 calculates a control target value of the drive power generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realizing the function of an advanced driver assistance system (ADAS) function including collision avoidance or shock mitigation of the vehicle, following travel based on an inter-vehicle distance, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information of a vicinity of the vehicle acquired in the vehicle exterior information detection unit 12030 or the vehicle interior information detection unit 12040 to perform cooperative control for the purpose of automatic drive of autonomous travel without depending on an operation of the driver or the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare such as by controlling the head lamps according to the position of a leading vehicle or an oncoming vehicle detected in the vehicle exterior information detection unit 12030, and switching high beam light to low beam light.

The sound image output unit 12052 transmits an output signal of at least one of a sound or an image to an output device that can visually and aurally notify a passenger of the vehicle or an outside of the vehicle of information. In the example in FIG. 26, as the output device, an audio speaker 12061, a display unit 12062, and an instrument panel 12063 are exemplarily illustrated. The display unit 12062 may include, for example, at least one of an on-board display or a head-up display.

Figure 27:
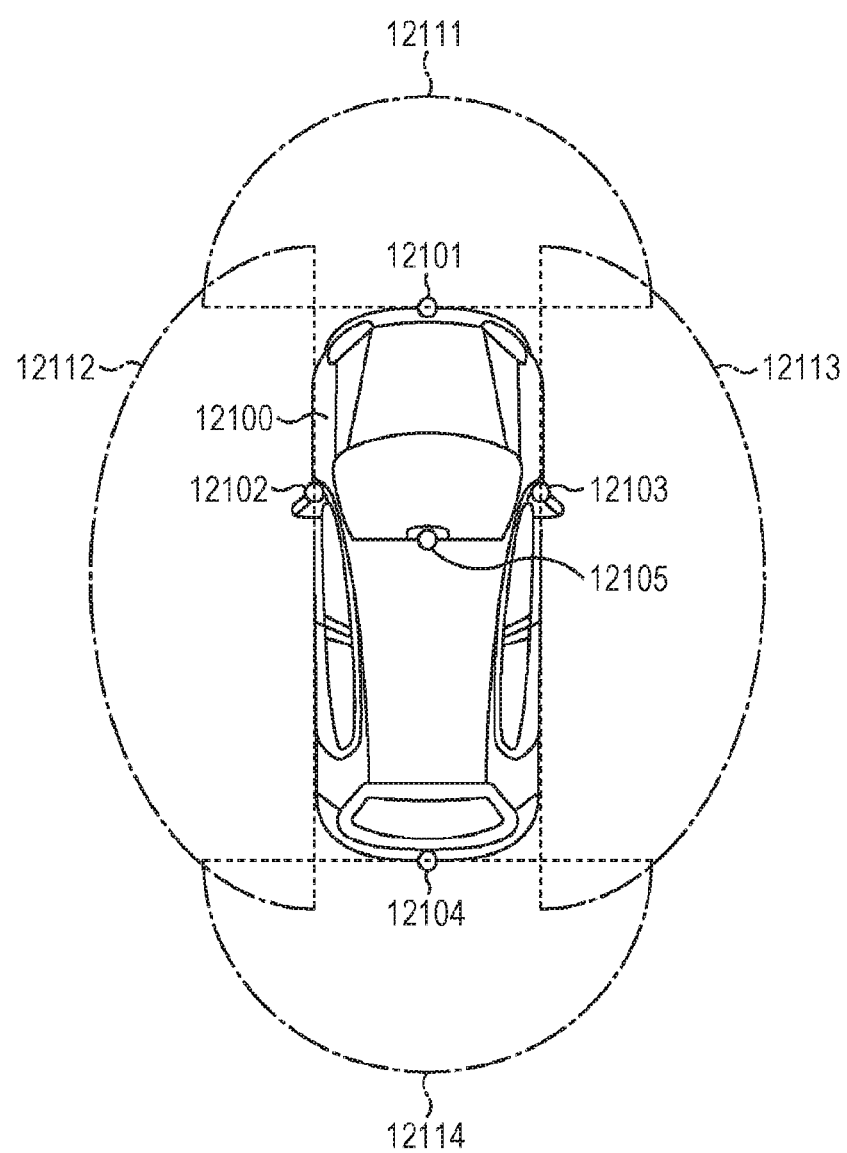
FIG. 27 is an explanatory diagram illustrating an example of installation positions of imaging units.

FIG. 27 is a diagram illustrating an example of an installation position of the imaging unit 12031.

In FIG. 27, imaging units 12101, 12102, 12103, 12104, and 12105 are included as the imaging unit 12031.

The imaging units 12101, 12102, 12103, 12104, and 12105 are provided at positions such as a front nose, side mirrors, a rear bumper, a back door, and an upper portion of a windshield in an interior of the vehicle 12100, for example. The imaging unit 12101 provided at the front nose and the imaging unit 12105 provided at an upper portion of the windshield in an interior of the vehicle mainly acquire images in front of the vehicle 12100. The imaging units 12102 and 12103 provided at the side mirrors mainly acquire images on sides of the vehicle 12100. The imaging unit 12104 provided at the rear bumper or the back door mainly acquires an image in back of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 26 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured by the imaging units 12101 to 12104.

At least one of the imaging units 12101 to 12104 may have a function to acquire distance information. For example, at least one of the imaging units 12101 to 12104 may be a stereo camera including a plurality of imaging elements or may be an imaging element having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract particularly a three-dimensional object closest to the vehicle 12100 on a traveling road and traveling at a predetermined speed (for example, 0 km/h or more) in substantially the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic drive of autonomous travel without depending on an operation of the driver or the like can be performed.

For example, the microcomputer 12051 classifies three-dimensional object data regarding three-dimensional objects into two-wheeled vehicles, ordinary cars, large vehicles, pedestrians, and other three-dimensional objects such as electric poles to be extracted, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. Then, the microcomputer 12051 determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon or the like representing the pedestrian at a desired position.

An example of a vehicle control system to which the technology according to the present disclosure is applicable has been described. The technology according to the present disclosure is applicable to the imaging unit 12031, of the above-described configurations. Specifically, the imaging device 100 in FIG. 1 can be applied to the imaging unit 12031. By applying the technology according to the present disclosure to the imaging unit 12031, a more easily viewable captured image can be obtained, and thus the driver's fatigue can be reduced.

Note that the above-described embodiments describe an example for embodying the present technology, and the matters in the embodiments and the matters used to specify the invention in the claims have correspondence, respectively. Similarly, the matters used to specify the invention in the claims and the matters in the embodiment of the present technology given the same names have correspondence, respectively. However, the present technology is not limited to the embodiments, and can be embodied by application of various modifications to the embodiments without departing from the gist of the present technology.

Furthermore, the processing procedures described in the above embodiments may be regarded as a method having these series of procedures, and also regarded as a program for causing a computer to execute these series of procedures and as a recording medium for storing the program. As this recording medium, for example, a compact disc (CD), a mini disc (MD), a digital versatile disc (DVD), a memory card, a Blu-ray (registered trademark) disc, or the like can be used.

Note that the effects described in the present specification are merely examples and are not limited, and other effects may be exhibited.

Note that the present technology can also have the following configurations.

(1) A solid-state image sensor including:

an effective pixel configured to generate an analog signal according to an amount of received light using a power supply from a power supply line as an effective pixel signal;

a correction signal generation unit configured to generate an analog signal including a noise component generated in the power supply line as a correction signal;

a selection circuit configured to sequentially select and output the effective pixel signal and the correction signal;

an analog-digital converter configured to perform processing of converting the output effective pixel signal into a digital signal and outputting the digital signal as effective pixel data and processing of converting the output correction signal into a digital signal and outputting the digital signal as correction data; and a signal processing unit configured to correct the effective pixel data on the basis of the correction data.

(2) The solid-state image sensor according to (1), in which the correction signal generation unit includes a shielded light shielding pixel.

(3) The solid-state image sensor according to (1), in which the correction signal generation unit includes a high-pass filter that allows pass of a high-frequency component higher than a predetermined frequency in a signal from the power supply line and outputs the high-frequency component as the correction signal.

(4) The solid-state image sensor according to any one of (1) to (3), in which the analog-digital converter is a successive approximation register analog to digital converter (SARADC).

(5) The solid-state image sensor according to any one of (1) to (4), further including:

a timing control unit configured to control operation timing of the selection circuit, in which a predetermined number of the selection circuits is arrayed, and the timing control unit causes any one of the predetermined number of selection circuits to output the correction signal and causes the remaining selection circuits to output the effective pixel signal.

(6) The solid-state image sensor according to (5), in which the timing control unit sequentially selects the predetermined number of selection circuits in a predetermined order and causes the selected selection circuit to output the correction signal.

(7) The solid-state image sensor according to (5), in which the timing control unit generates a random number indicating any one of the predetermined number of selection circuits, selects the selection circuit indicated by the random number, and causes the selected selection circuit to output the correction signal.

(8) The solid-state image sensor according to any one of (1) to (7), in which a predetermined number of the effective pixels is arrayed in a pixel array unit in a two-dimensional grid manner, the pixel array unit is divided into a plurality of effective pixel areas, and the selection circuit sequentially selects the effective pixel signal and the correction signal from any one of the plurality of effective pixel areas.

(9) The solid-state image sensor according to (7), in which the effective pixels are arrayed in a Bayer array in the pixel array unit.

(10) The solid-state image sensor according to (7), in which each of a plurality of adjacent effective pixels in the pixel array unit photoelectrically converts light in same color to generate the effective pixel signal.

(11) The solid-state image sensor according to (7), in which a pair of the adjacent effective pixels in the pixel array unit are pixels for detecting a phase difference of a pair of images.

(12) The solid-state image sensor according to (7), in which
a plurality of effective pixels having different light receiving areas from one another is arrayed in the pixel array unit.

(13) An imaging device including:
an effective pixel configured to generate an analog signal according to an amount of received light using a power supply from a power supply line as an effective pixel signal;
a correction signal generation unit configured to generate an analog signal including a noise component generated in the power supply line as a correction signal;
a selection circuit configured to sequentially select and output the effective pixel signal and the correction signal;
an analog-digital converter configured to perform processing of converting the output effective pixel signal into a digital signal and outputting the digital signal as effective pixel data and processing of converting the output correction signal into a digital signal and outputting the digital signal as correction data;
a signal processing unit configured to correct the effective pixel data on the basis of the correction data; and
an image processing unit configured to execute predetermined image processing for image data including the corrected effective pixel data.

(14) A method of controlling a solid-state image sensor including:
an effective pixel signal generation process of generating an analog signal according to an amount of received light using a power supply from a power supply line as an effective pixel signal;
a correction signal generation process of generating an analog signal including a noise component generated in the power supply line as a correction signal;
a selection process of sequentially selecting and outputting the effective pixel signal and the correction signal;
an analog-digital conversion process of performing processing of converting the output effective pixel signal into a digital signal and outputting the digital signal as effective pixel data and processing of converting the output correction signal into a digital signal and outputting the digital signal as correction data; and
a signal processing process of correcting the effective pixel data on the basis of the correction data.

REFERENCE SIGNS LIST

100 Imaging device
110 Imaging lens
120 Image processing unit
130 Imaging control unit
140 Recording unit
200 Solid-state image sensor
201 Pixel chip
202 Logic chip
210 Pixel array unit
220 Scanning circuit
230, 270 AD conversion unit
231, 311, 391 Multiplexer
232 Switch
240 ADC
241 Sample and hold circuit
242 DAC
243 Comparator
244 SAR logic circuit
245 Register
250 Signal processing unit
251 CDS processing unit
252 Correction unit
253 Rear stage processing unit
260 Timing control unit
280 Power supply fluctuation detection unit
281 High-pass filter
282 Amplifier
310, 390 Selection unit
320, 380 Light shielding area
330 Light shielding pixel block
331 Light shielding pixel
340 Effective pixel area
350 Effective pixel block
351, 372, 373, 374, 375, 376 Effective pixel
352, 353, 356, 357, 360, 361, 364, 365 Selection transistor
354, 355, 358, 359, 362, 363, 366, 367 Photodiode
368 Reset transistor
369 Floating diffusion layer
370 Amplification transistor
371 Selection transistor
12031 Imaging unit

The invention claimed is:

1. A solid-state image sensor, comprising:
an effective pixel configured to generate a first analog signal as an effective pixel signal based on an amount of received light and a power supply from a power supply line;
a high-pass filter configured to:
allow pass of a high-frequency component higher than a specific frequency in a signal from the power supply line; and
output the high-frequency component as a correction signal;
a selection circuit configured to sequentially select and output the effective pixel signal and the correction signal;
an analog-digital converter configured to:
convert the output effective pixel signal into a first digital signal;
output first digital signal as effective pixel data;
convert the output correction signal into a second digital signal; and
output the second digital signal as correction data; and
a signal processing unit configured to correct the effective pixel data based on the correction data.

2. The solid-state image sensor according to claim 1, further comprising a shielded light shielding pixel configured to generate, as the correction signal, a second analog signal including a noise component generated in the power supply line.

3. The solid-state image sensor according to claim 1, wherein the analog-digital converter is a successive approximation register analog to digital converter (SARADC).

4. The solid-state image sensor according to claim 1, further comprising:
a specific number of selection circuits that includes the selection circuit; and
a timing control unit configured to:
control operation timing of the selection circuit, and
cause the selection circuit of the specific number of selection circuits to output the correction signal; and
cause remaining selection circuits of the specific number of selection circuits to output the effective pixel signal.

5. The solid-state image sensor according to claim 4, wherein the timing control unit is further configured to:
sequentially select the specific number of selection circuits in a specific order; and cause one of the sequentially selected specific number of selection circuits to output the correction signal.

6. The solid-state image sensor according to claim 4, wherein the timing control unit is further configured to:
generate a random number indicating the selection circuit the specific number of selection circuits;
select the selection circuit indicated by the random number; and
cause the selected selection circuit to output the correction signal.

7. The solid-state image sensor according to claim 1, further comprising a specific number of effective pixels in a pixel array unit in a two-dimensional grid, wherein
the pixel array unit is divided into a plurality of effective pixel areas, and
the selection circuit is further configured to sequentially select the effective pixel signal and the correction signal from one of the plurality of effective pixel areas.

8. The solid-state image sensor according to claim 7, wherein the specific number of effective pixels is in a Bayer array in the pixel array unit.

9. The solid-state image sensor according to claim 7, wherein each of a plurality of adjacent effective pixels in the pixel array unit is configured to photoelectrically convert light in same color to generate the effective pixel signal.

10. The solid-state image sensor according to claim 7, wherein a pair of adjacent effective pixels in the pixel array unit is configured to detect a phase difference of a pair of images.

11. The solid-state image sensor according to claim 7, wherein a first effective pixel of the specific number of effective pixels has a light receiving area different from a light receiving area of a second effective pixel of the specific number of effective pixels.

12. An imaging device, comprising:
an effective pixel configured to generate an analog signal as an effective pixel signal based on an amount of received light and a power supply from a power supply line;
high-pass filter configured to:
allow pass of a high-frequency component higher than a specific frequency in a signal from the power supply line; and
output the high-frequency component as a correction signal;
a selection circuit configured to sequentially select and output the effective pixel signal and the correction signal;
an analog-digital converter configured to:
convert the output effective pixel signal into a first digital signal;
output the first digital signal as effective pixel data;
convert the output correction signal into a second digital signal; and
output the second digital signal as correction data;
a signal processing unit configured to correct the effective pixel data based on the correction data; and
an image processing unit configured to execute specific image processing for image data including the corrected effective pixel data.

13. A method of controlling a solid-state image sensor, the method comprising:
generating an analog signal as an effective pixel signal based on an amount of received light and a power supply from a power supply line;
allowing pass of a high-frequency component higher than a specific frequency in a signal from the power supply line;
outputting the high-frequency component as a correction signal;
sequentially selecting and outputting the effective pixel signal and the correction signal;
converting the output effective pixel signal into a first digital signal;
outputting the first digital signal as effective pixel data;
converting the output correction signal into a second digital signal; outputting the second digital signal as correction data; and
correcting the effective pixel data based on the correction data.

* * * * *